(12) United States Patent
Kageyama et al.

(10) Patent No.: US 12,490,549 B2
(45) Date of Patent: Dec. 2, 2025

(54) METHOD FOR MANUFACTURING LIGHT-EMITTING DEVICE

(71) Applicant: NICHIA CORPORATION, Anan (JP)

(72) Inventors: Hiroaki Kageyama, Tokushima (JP); Koji Nishino, Tokushima (JP); Kenji Ozeki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 630 days.

(21) Appl. No.: 17/891,132

(22) Filed: Aug. 19, 2022

(65) Prior Publication Data

US 2023/0099246 A1   Mar. 30, 2023

(30) Foreign Application Priority Data

Sep. 30, 2021  (JP) ................ 2021-161016
May 12, 2022  (JP) ................ 2022-078658

(51) Int. Cl.
*H10H 20/01*   (2025.01)
*H01L 25/075*  (2006.01)
*H10H 20/857*  (2025.01)

(52) U.S. Cl.
CPC ......... *H10H 20/01* (2025.01); *H01L 25/0753* (2013.01); *H10H 20/857* (2025.01); *H10H 20/0364* (2025.01)

(58) Field of Classification Search
CPC .. H10H 20/01; H10H 20/857; H10H 20/0364; H01L 25/0753
USPC .......................................................... 438/4
See application file for complete search history.

(56) References Cited

U.S. PATENT DOCUMENTS

| | | | |
|---|---|---|---|
| 2018/0342492 A1 | 11/2018 | Lu | |
| 2018/0358339 A1 | 12/2018 | Iguchi | |
| 2019/0181016 A1* | 6/2019 | Liao | H01L 21/485 |
| 2020/0126963 A1* | 4/2020 | Lee | H01L 25/0655 |
| 2020/0152827 A1* | 5/2020 | Chen | H10H 20/857 |
| 2020/0212262 A1* | 7/2020 | Jang | H01L 25/0756 |
| 2020/0321391 A1* | 10/2020 | Danesh | H10H 29/142 |
| 2021/0193894 A1* | 6/2021 | You | H01L 25/0753 |

FOREIGN PATENT DOCUMENTS

| | | |
|---|---|---|
| JP | 08-340000 | 12/1996 |
| JP | 09-129648 | 5/1997 |
| JP | 10-012670 | 1/1998 |

(Continued)

*Primary Examiner* — Igwe U Anya
(74) *Attorney, Agent, or Firm* — MORI & WARD, LLP

(57) ABSTRACT

A method for manufacturing a light-emitting device includes preparing first and second members. The first member includes first elements having first bonding parts. The second member includes a wiring substrate and second bonding parts. The method includes bonding the first bonding part and the second bonding part at a first bonding condition. The method includes evaluating an electrical characteristic of the first elements. The method includes removing, from the wiring substrate, a defective first element determined by the evaluation to be defective. The method includes placing a second element having a third bonding part on a region of the wiring substrate at which the defective first element had been removed. The method includes bonding the first bonding part and the second bonding part, and the third bonding part and the second bonding part at a second bonding condition.

19 Claims, 18 Drawing Sheets

(56) References Cited

FOREIGN PATENT DOCUMENTS

| | | |
|---|---|---|
| JP | 2014-179380 | 9/2014 |
| JP | 2020-074005 | 5/2020 |
| JP | 2020-521180 | 7/2020 |

* cited by examiner

METHOD FOR MANUFACTURING LIGHT-EMITTING DEVICE

CROSS-REFERENCE TO RELATED APPLICATIONS

This application is based upon and claims the benefit of priority from the prior Japanese Patent Application No. 2021-161016, filed on Sep. 30, 2021; the entire contents of which are incorporated herein by reference.

This application is based upon and claims the benefit of priority from the prior Japanese Patent Application No. 2022-078658, filed on May 12, 2022; the entire contents of which are incorporated herein by reference.

FIELD

The present disclosure relates to a method for manufacturing a light-emitting device.

BACKGROUND

JP-A 2020-074005 discusses a light-emitting device in which many semiconductor elements are mounted on one wiring substrate. In such a light-emitting device, when a defective part exists among the semiconductor elements mounted to the wiring substrate, a process is necessary to remove the defective part and replace with a good part. However, there is a risk that the replacement process may undesirably reduce the productivity of the light-emitting device.

SUMMARY

Embodiments of the present disclosure are directed to a method for manufacturing a light-emitting device in which defective elements can be efficiently replaced.

According to one aspect of the present disclosure, a method for manufacturing a light-emitting device is provided that includes preparing a first member, and a second member. The first member includes a support substrate, and a plurality of first elements. Each of the plurality of first elements includes a light extraction surface, and a first bonding part located at a surface at a side opposite to the light extraction surface. The plurality of first elements is located on the support substrate so that the light extraction surfaces face the support substrate. The second member includes a wiring substrate, and a plurality of second bonding parts located on the wiring substrate. The method includes bonding the first bonding part and the second bonding part at a first bonding condition and releasing the support substrate from the first element. The method includes evaluating an electrical characteristic of the plurality of first elements. The method includes removing, from the wiring substrate, a defective first element of the plurality of first elements that is determined by the evaluation to be defective by releasing the defective first element from the second bonding part. The method includes placing a second element on a region of the wiring substrate at which the defective first element had been removed to cause a third bonding part of the second element to contact the second bonding part to which the first bonding part of the defective first element had been bonded. The method includes bonding the first bonding part and the second bonding part at a second bonding condition and bonding, at the second bonding condition, the third bonding part and the second bonding part to which the first bonding part of the defective first element had been bonded.

According to embodiments of the present disclosure, a method for manufacturing a light-emitting device can be realized in which defective elements can be efficiently replaced.

DETAILED DESCRIPTION

Figure 1A:
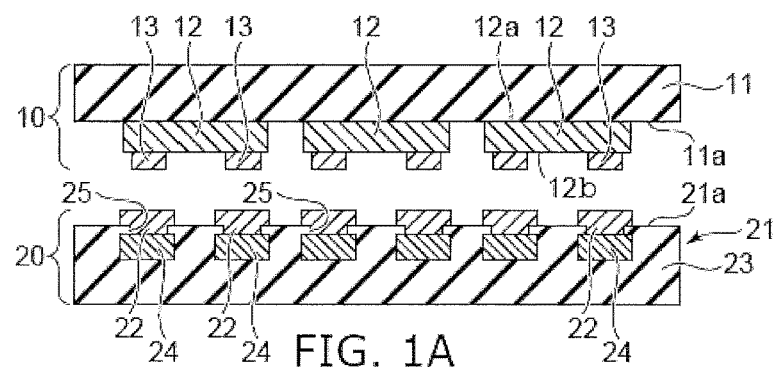
FIG. 1A is a cross-sectional view showing a method for manufacturing a light-emitting device according to a first embodiment.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described in regard to a drawing hereinabove are marked with like reference numerals, and a detailed description is omitted as appropriate. There are also cases where an end view showing only a cross section is used as a cross-sectional view.

First Embodiment

Figure 1B:
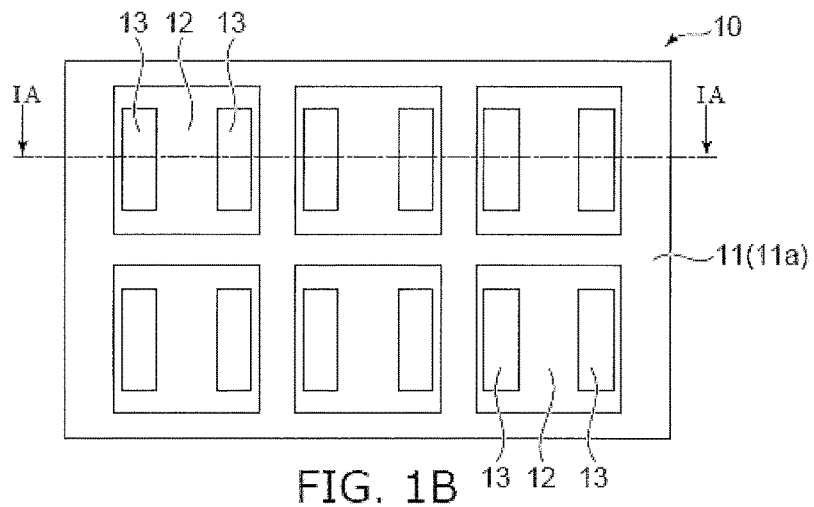
FIG. 1B is a bottom view showing a first member.
Figure 1C:
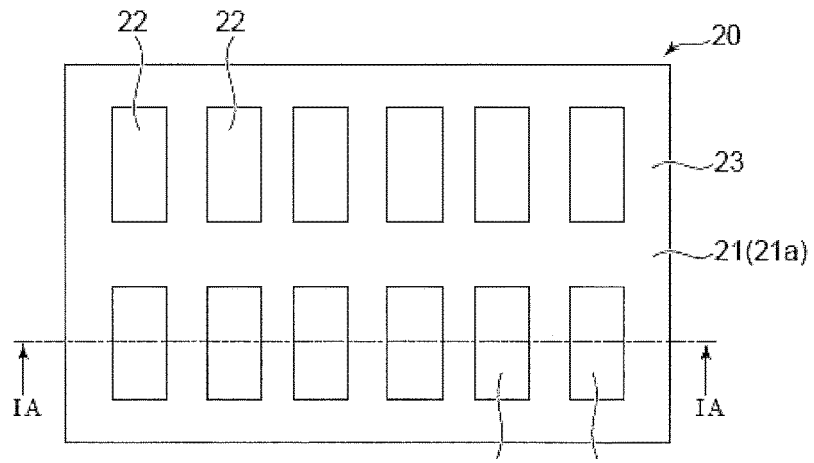
FIG. 1C is a top view showing a second member.

FIG. 1A is a cross-sectional view showing a method for manufacturing a light-emitting device according to a first embodiment. FIG. 1B is a bottom view showing a first member. FIG. 1C is a top view showing a second member.

Figure 2A:
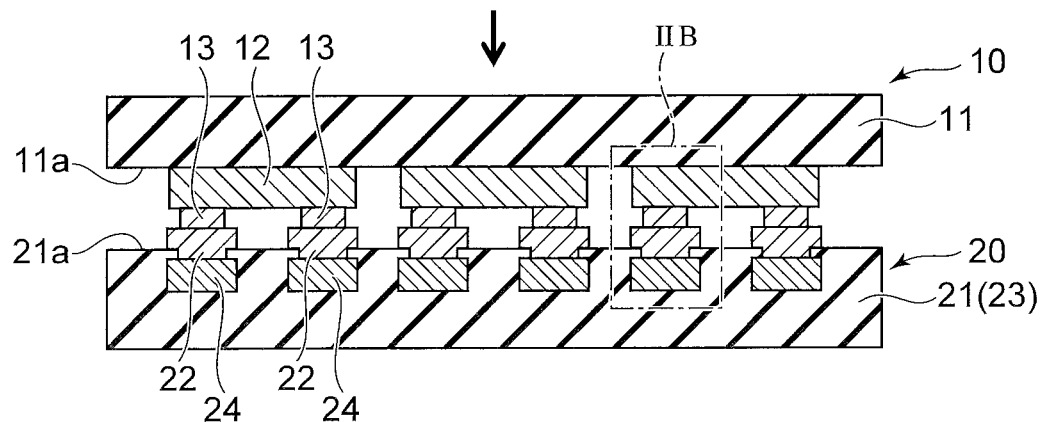
FIG. 2A is a cross-sectional view showing the method for manufacturing the light-emitting device according to the first embodiment.
Figure 2B:
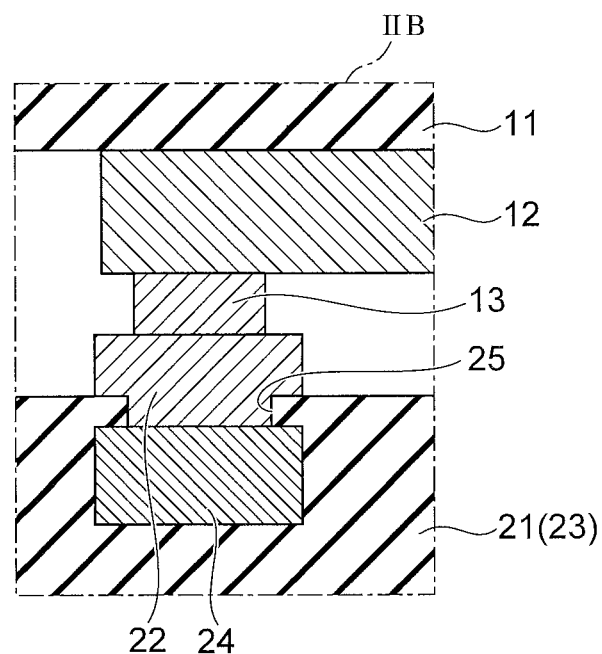
FIG. 2B is a partially enlarged cross-sectional view showing region IIB of FIG. 2A.

FIG. 2A is a cross-sectional view showing the method for manufacturing the light-emitting device according to the embodiment. FIG. 2B is a partially enlarged cross-sectional view showing region JIB of FIG. 2A.

FIGS. 3 to 7 are cross-sectional views for describing the method for manufacturing the light-emitting device according to the embodiment.

Figure 8A:
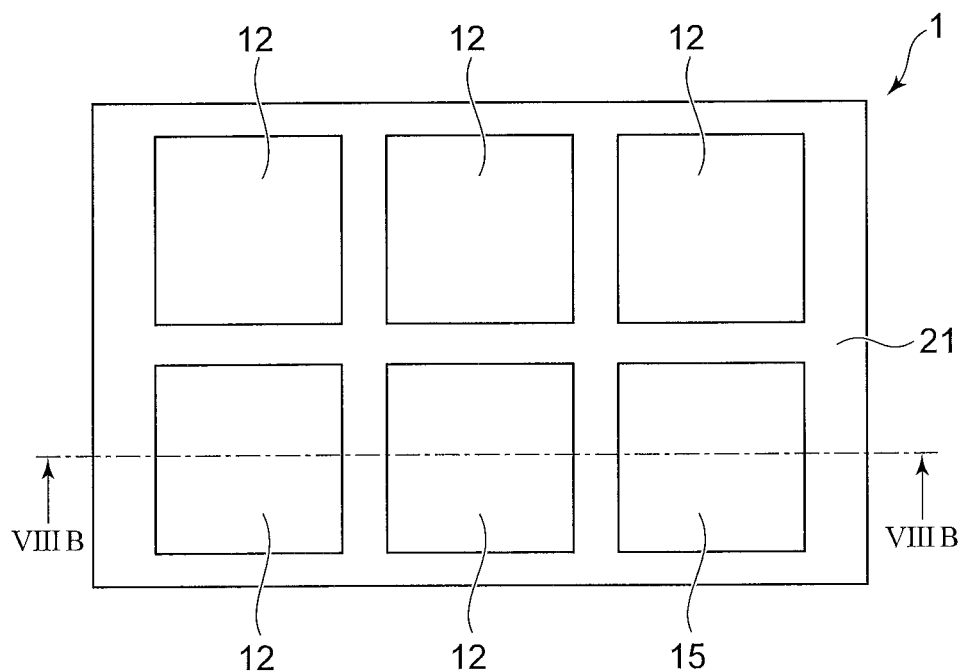
FIG. 8A is a top view showing the light-emitting device according to the first embodiment.
Figure 8B:
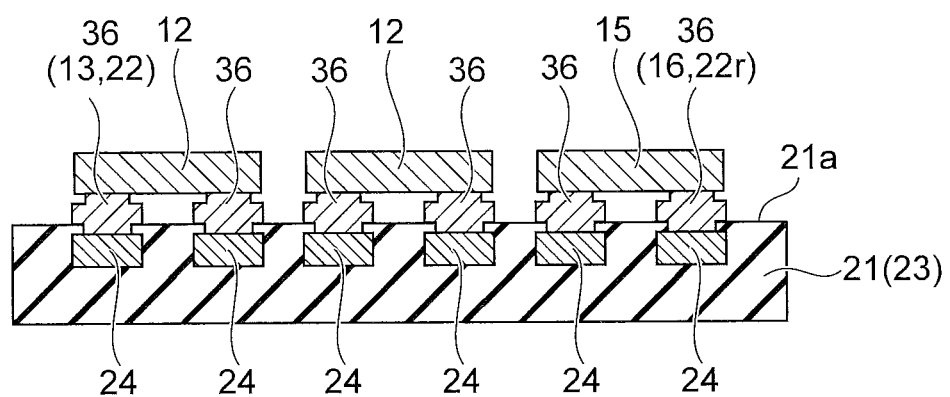
FIG. 8B is a cross-sectional view along line VIIIB-VIIIB shown in FIG. 8A.

FIG. 8A is a top view showing the light-emitting device according to the embodiment. FIG. 8B is a cross-sectional view along line VIIIB-VIIIB shown in FIG. 8A.

Preparation Process of First and Second Members

A first member 10 is prepared as shown in FIGS. 1A and 1B. The first member 10 includes one support substrate 11 and multiple first elements 12. The multiple first elements 12 each include a light extraction surface 12a, and a first bonding part 13 located at a surface 12b at the side opposite to the light extraction surface 12a. The multiple first elements 12 are located on the support substrate 11 so that the light extraction surfaces face the support substrate 11. Each first element 12 includes the first bonding part 13. The first bonding part 13 includes gold (Au). For example, at least the outermost surface of the first bonding part 13 is made of gold (Au). The light extraction surface 12a of the first element 12 is the surface from which the light is mainly extracted from the first element 12.

For example, the multiple first elements 12 are arranged in a matrix arrangement at a first surface 11a of the support substrate 11. However, the arrangement of the first elements 12 is not limited to a matrix arrangement and is arbitrary. The first element 12 is, for example, a light-emitting element, e.g., a light-emitting diode (LED). Each first element 12 includes, for example, two first bonding parts 13. The two first bonding parts 13 of the first element 12 function as anode or cathode electrodes of the first element 12.

The support substrate 11 is, for example, a transfer jig and includes, for example, silicon, glass, or sapphire. The first surface 11a of the support substrate 11 may be adhesive. In such a case, the first element 12 is bonded to the adhesive first surface 11a of the support substrate 11. The support substrate 11 can include, for example, a member in which an adhesive resin is located on the surface of a sapphire substrate.

Also, a second member 20 is prepared as shown in FIGS. 1A and 1C. The second member 20 includes one wiring substrate 21 and multiple second bonding parts 22. The multiple second bonding parts 22 are located on the wiring substrate 21. The second bonding part 22 includes gold. For example, at least the outermost surface of the second bonding part 22 is made of gold (Au).

For example, the multiple second bonding parts 22 are arranged in a matrix arrangement at a second surface 21a of the wiring substrate 21. However, the arrangement of the second bonding parts 22 is not limited to a matrix arrangement and is arbitrary. The multiple first bonding parts 13 and the multiple second bonding parts 22 are located at positions so that one first bonding part 13 contacts one second bonding part 22 each when the first surface 11a of the support substrate 11 and the second surface 21a of the wiring substrate 21 are caused to face each other.

In the example shown in FIGS. 1A and 1C, the wiring substrate 21 includes an insulating base material 23, and multiple electrically-conductive interconnects 24 located inside the base material 23. Multiple openings 25 are formed in the base material 23 at the second surface 21a, and the interconnects 24 are exposed in the multiple openings 25. The base material 23 covers the region of the surface of the interconnect 24 not exposed in the opening 25. The second bonding part 22 is located at the second surface 21a of the wiring substrate 21 and inside the opening 25. For example, the cross-sectional shape of the second bonding part 22 has an upper surface that is nearly flat. The second bonding parts 22 are connected to the interconnects 24 in the openings 25. The cross-sectional shape of the second bonding part 22 is not limited to having a nearly-flat upper surface and can have, for example, a recess in the upper surface reflecting the shape of the opening 25.

Bonding Process of First Bonding Part and Second Bonding Part at First Bonding Condition Then, as shown in FIGS. 2A and 2B, the first bonding parts 13 and the second bonding parts 22 are bonded at a first bonding condition. Then, the support substrate 11 is released from the first elements 12. The bonding between the first bonding parts 13 and the second bonding parts 22 is performed by causing the first surface 11a of the support substrate 11 to face the second surface 21a of the wiring substrate 21 and by causing the first bonding parts 13 to contact the second bonding parts 22.

For example, the first bonding condition includes applying heat to the first and second bonding parts 13 and 22 and applying a load in the direction of mutual approach. In the first bonding condition, for example, it is favorable to apply heat to a temperature of not less than 80 degrees and not more than 200 degrees. The temperature of the first bonding condition is, for example, 140 degrees. In the first bonding condition, it is favorable for the applied load to be, for example, not less than 10 MPa but less than 150 MPa, more favorably not less than 10 MPa but less than 100 MPa, and more favorably not less than 10 MPa but less than 40 MPa. The load in the first bonding condition is, for example, 30 MPa. It is favorable for the duration of applying the load in the first bonding condition to be, for example, not less than 0.1 seconds and not more than 10 seconds. The duration of applying the load in the first bonding condition is, for example, 0.5 seconds.

Before causing the first bonding part 13 to contact the second bonding part 22, plasma processing can be performed on the first surface 11a side of the support substrate 11 of the first member 10 at which the first elements 12 are located and the second surface 21a side of the wiring substrate 21 of the second member 20 at which the second bonding parts 22 are located. The surface of the first bonding part 13 and the surface of the second bonding part 22 are activated thereby, and the bondability between the first bonding part 13 and the second bonding part 22 can be further improved. It is favorable not to apply ultrasonic waves in the first bonding condition.

In this process, portions of the surfaces of the first and second bonding parts 13 and 22 are bonded to each other while the first bonding part 13 and the second bonding part 22 substantially maintain the shapes before bonding. For example, when a recess is formed in the upper surface of the second bonding part 22 before bonding, a void may remain between the first bonding part 13 and the recess of the second bonding part 22. By bonding the first bonding part 13 and the second bonding part 22 at the first bonding condition, the first bonding part 13 and the second bonding part 22 are electrically connected but have a lower mechanical bonding strength than the bonding strength due to a second bonding condition described below. Herein, such a state realized according to the first bonding condition is called a "temporary bonded state". Thereby, the first elements 12 are bonded to the wiring substrate 21. Subsequently, the support substrate 11 is released from the first elements 12.

Evaluation Process of Electrical Characteristic of First Element

Figure 3:
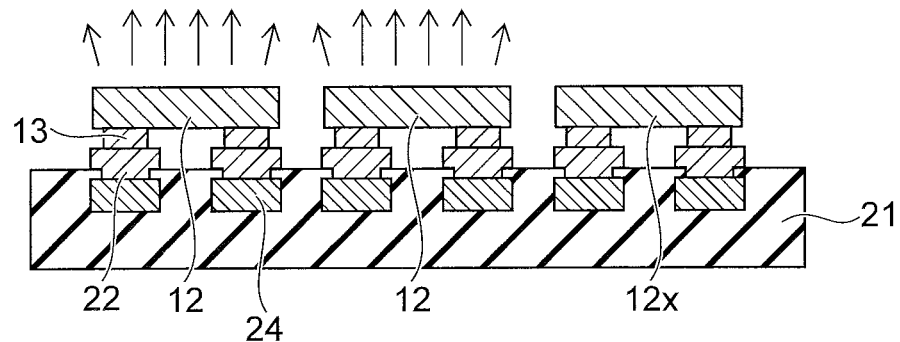
FIGS. 3 to 7 are cross-sectional views for describing the method for manufacturing the light-emitting device according to the first embodiment.

Then, as shown in FIG. 3, electrical power is supplied to the multiple first elements 12 via the wiring substrate 21, and an electrical characteristic of the first elements 12 is evaluated. When the first elements 12 are light-emitting elements, the electrical characteristic to be evaluated is, for example, the luminance of the light emitted from each light-emitting element when a voltage is applied to the light-emitting element. By evaluating such an electrical characteristic, the multiple first elements 12 that are bonded to the wiring substrate 21 are classified as good or defective. For example, a light-emitting element having a luminance not less than a reference value is considered good, and a light-emitting element having a luminance less than the reference value is considered defective. Hereinbelow, the first element 12 that is determined to be defective also is called a "first element 12x" (also referred to herein as a "defective first element"). The second bonding part 22 to which the first element 12 determined to be defective in the process of evaluating the electrical characteristic of the first element 12 is bonded is called a "second bonding part 22r".

Figure 4:
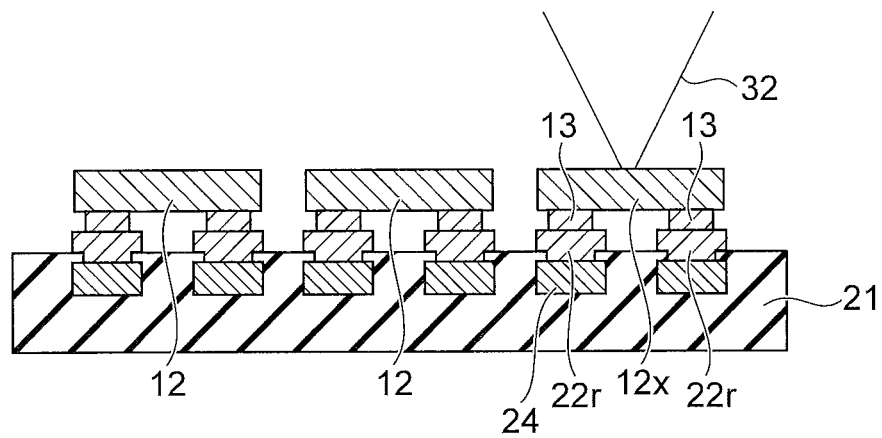
Figure 5:
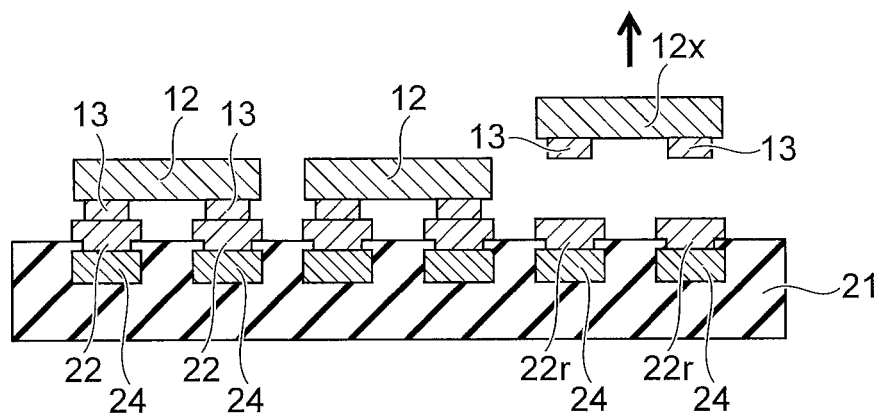

Removal Process of First Element Determined to be Defective from Wiring Substrate Then, as shown in FIGS. 4 and 5, the first element 12x that is determined to be defective is removed from the wiring substrate 21 by releasing the first bonding part 13 of the first element 12x determined to be defective from the second bonding part 22r of the wiring substrate 21. For example, according to the embodiment, the first element 12x is heated by irradiating laser light 32 on the first element 12x. Thereby, thermal stress is applied to the interface between the first bonding part 13 and the second bonding part 22r, and the first bonding part 13 of the first element 12x is removed from the second bonding part 22r.

When the first element 12x is a light-emitting element that includes a semiconductor layer, the laser light 32 is concentrated at the upper surface of the semiconductor layer. When the first element 12x includes a sapphire substrate and a semiconductor layer located on the sapphire substrate, the laser light 32 is irradiated toward the sapphire substrate side, passes through the sapphire substrate, and is concentrated at the upper surface of the semiconductor layer. Thereby, thermal stress between the second bonding part 22r and the semiconductor layer on which the laser light 32 is concentrated is generated by thermal expansion of the semiconductor layer, and the first bonding part 13 is removed from the second bonding part 22r.

For example, the first element 12x can be removed by attaching the first element 12x to an adhesive jig. Or, the first element 12x can be suctioned off by an aspirator, or can be removed by being blown off by locally blowing air.

Process of Causing Contact of Third and Second Bonding Parts

Figure 6:
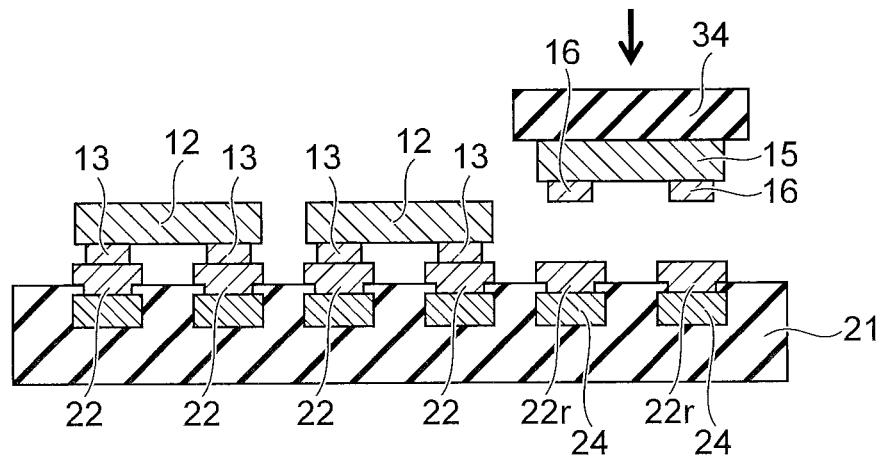

Then, a second element 15 is prepared as shown in FIG. 6. For example, the second element 15 has the same structure as the first element 12. The second element 15 includes a third bonding part 16. The third bonding part 16 includes gold. For example, the second element 15 includes two third bonding parts 16. The two third bonding parts 16 of the second element 15 function as anode or cathode electrodes of the second element 15.

Then, a jig 34 holds the second element 15 and places the second element 15 in the region of the wiring substrate 21 at which the removed first element 12x had been placed and removed. Thereby, the second and third bonding parts 22r and 16 of the second element 15 are brought into contact. Then, the jig 34 is released from the second element 15.

Plasma processing of the wiring substrate 21 and the second element 15 can be performed before the contact between the second bonding part 22r and the third bonding part 16 of the second element 15. The surface of the second bonding part 22r and the surface of the third bonding part 16 of the second element 15 are activated thereby. At this time, the plasma flows around between the wiring substrate 21 and the first elements 12 and activates the first bonding parts 13 of the first elements 12 determined to be good as well as the surfaces of the second bonding parts 22 temporarily bonded to the first bonding parts. Thereby, the first bonding parts 13 and the second bonding parts 22 can be more securely bonded in the process of bonding at the second bonding condition described below.

The laser light can be irradiated on the wiring substrate 21 before the contact between the second bonding part 22r and the third bonding part 16 of the second element 15. Any metal residue or the like that remains on the surface of the wiring substrate 21 after the process of removing the first element 12x determined to be defective from the wiring substrate 21 can be removed thereby. As a result, the second and third bonding parts 22r and 16 of the second element 15 can be more securely bonded in the process of bonding at the second bonding condition described below.

Bonding Process of Second Bonding Condition

Figure 7:
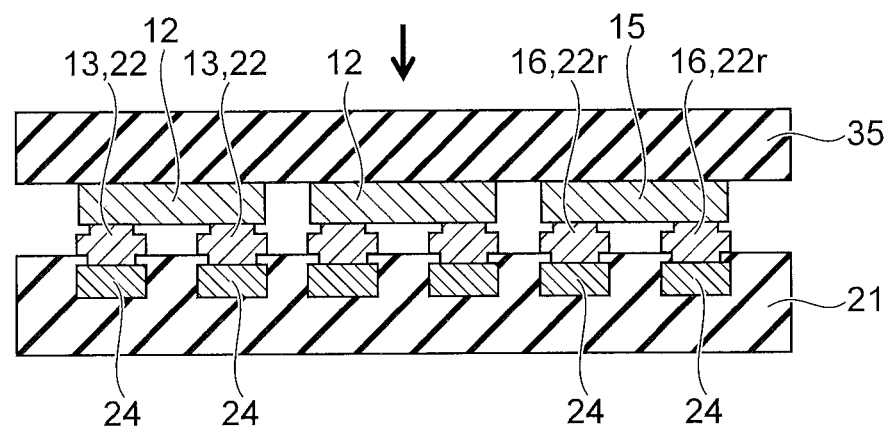

Then, as shown in FIG. 7, a load is applied to the first and second elements 12 and 15 in the direction of the wiring substrate 21 by using a jig 35. The first bonding parts 13 and the second bonding parts 22 that are in the temporary bonded state are bonded thereby, as well as the third bonding part 16 of the newly-placed second element 15 and the second bonding part 22r to which the first bonding part 13 of the removed first element 12x had been bonded. The jig 35 can have the same arrangement as the support substrate 11, or the support substrate 11 can be used again.

The bonding between the first bonding part 13 and the second bonding part 22 and the bonding between the third bonding part 16 and the second bonding part 22r in this process are performed at the second bonding condition. Compared to the first bonding condition, at least one of the temperature or the load is higher in the second bonding condition. In other words, the temperature of the second bonding condition is greater than the temperature of the first bonding condition, the load of the second bonding condition is greater than the load of the first bonding condition, or the temperature of the second bonding condition is greater than the temperature of the first bonding condition and the load of the second bonding condition is greater than the load of the first bonding condition. It is favorable for the duration of applying the load in the second bonding condition to be greater than the duration of applying the load in the first bonding condition. At least one of the load and the temperature of the first bonding condition and at least one of the load and the temperature of the second bonding condition can be equal, and the duration of applying the load in the second bonding condition can be greater than the duration of applying the load in the first bonding condition.

For example, it is favorable for the temperature to be not less than 200 degrees and not more than 300 degrees in the second bonding condition. For example, the temperature of the second bonding condition is set to 200 degrees. It is favorable for the load applied to the first and second bonding parts 13 and 22 to be not less than 40 MPa and not more than 200 MPa in the second bonding condition. For example, the applied load in the second bonding condition is set to 120 MPa. It is favorable for the bonding time to be not less than 1 second and not more than 60 seconds in the second bonding condition. The bonding time in the second bonding condition is, for example, 30 seconds. Similarly to the first bonding condition, it is favorable not to apply ultrasonic waves in the second bonding condition as well. A load may not be applied in the second bonding condition.

Thereby, the first bonding part 13 and the second bonding part 22 are more securely bonded, and the third bonding part 16 and the second bonding part 22r are bonded. At this time, the two bonding parts that are bonded to each other become a continuous body, and the greater part of the interface disappears. Also, the greater part of any voids that had occurred at the interface disappears. The third bonding part 16 and the second bonding part 22r are electrically connected thereby, and the mechanical bonding strength between the first bonding part 13 and the second bonding part 22 and the mechanical bonding strength between the third bonding part 16 and the second bonding part 22r are greater than those in the temporary bonded state. Hereinbelow, such a state realized by the second bonding condition is called the "main bonded state". The first element 12 and the second element 15 are securely bonded to the wiring substrate 21 by bonding at the second bonding condition. Then, the jig 35 is released from the first and second elements 12 and 15. Thus, a light-emitting device 1 is manufactured.

When all of the first elements 12 are determined to be good in the evaluation process of the electrical characteristic of the first element 12 shown in FIG. 3, the process of bonding at the second bonding condition shown in FIG. 7 is performed without performing the removal process of the first element 12x shown in FIGS. 4 and 5 and the placement process of the second element 15 shown in FIG. 6.

Light-Emitting Device

As shown in FIGS. 8A and 8B, the light-emitting device 1 according to the embodiment includes the wiring substrate 21, the first element 12 that includes a fourth bonding part 36, and the second element 15 that includes the fourth bonding part 36. The wiring substrate 21 includes the insulating base material 23 and the multiple electrically-conductive interconnects 24 located in the base material 23. The first element 12 and the second element 15 are arranged in, for example, a matrix arrangement at the second surface 21a of the wiring substrate 21.

For example, the first element 12 and the second element 15 have the same structure and are, for example, light-emitting diodes. The first element 12 and the second element 15 are electrically connected and mechanically bonded to the interconnect 24 of the wiring substrate 21 via the fourth bonding part 36. The fourth bonding part 36 is formed of the continuous body of the first and second bonding parts 13 and 22 or the continuous body of the third and second bonding parts 16 and 22r. Accordingly, the fourth bonding part 36 includes gold.

Effects of the embodiment will now be described.

As the first bonding process according to the embodiment, the first bonding parts 13 of the multiple first elements 12 are bonded to the second bonding parts 22 of the wiring substrate 21 in the process shown in FIGS. 2A and 2B, after which the process of evaluating the electrical characteristic of each first element 12 is performed in the process shown in FIG. 3. Then, the first element 12x that is determined to be defective in the process of evaluating the electrical characteristic of the first element 12 is removed in the process shown in FIGS. 4 and 5. Then, in the process shown in FIG. 6, the second element 15 is placed on the region of the wiring substrate 21 from which the first element 12x was removed. Then, as the second bonding process, the first bonding part 13 of the first element 12 determined to be good is bonded to the second bonding part 22, and the newly-placed second element 15 is bonded to the second bonding part 22r to which the first element 12x determined to be defective had been bonded in the process shown in FIG. 7.

Thereby, the multiple first elements 12 can be collectively connected electrically to the wiring substrate 21 in the first bonding process, and the electrical characteristics of the multiple first elements 12 can be evaluated via the wiring substrate 21. Then, after removing only the first element 12x that is determined to be defective as the evaluation result of the electrical characteristics of the first elements 12, the second element 15 is placed on the region of the wiring substrate 21 from which the first element 12x was removed. Subsequently, by performing the second bonding process, the good first elements 12 are bonded to the wiring substrate 21, and the new second element 15 also is bonded to the wiring substrate 21. As a result, the defective first element 12x can be efficiently replaced, and the productivity of the light-emitting device 1 is increased.

According to the embodiment, the first bonding process is performed using the first bonding condition, and the second bonding process is performed using the second bonding condition. Compared to the first bonding condition, at least one of the temperature or the load is higher in the second bonding condition. Thereby, in the bonding process at the first bonding condition, the first bonding part 13 is electrically connected to the second bonding part 22, but is in a temporary bonded state having a lower mechanical bonding strength than the main bonded state. It is therefore easier to remove the first element 12x determined to be defective while evaluating the electrical characteristic of the first element 12. On the other hand, in the bonding process at the second bonding condition, the bonding strength of the first and second bonding parts 13 and 22 and the bonding strength of the third and second bonding parts 16 and 22r reach the main bonded state that is stronger than the temporary bonded state. As a result, the bonding strength of the first and second elements 12 and 15 with the wiring substrate 21 can be increased, thereby increasing the reliability of the light-emitting device 1.

According to the embodiment, thermal stress is generated between the first bonding part 13 of the first element 12x and the second bonding part 22r of the wiring substrate 21 by heating the first element 12x determined to be defective. Thereby, the bond between the first bonding part 13 and the second bonding part 22r can be released while suppressing damage of the wiring substrate 21. By irradiating the laser light 32 on the first element 12x, only the first element 12x determined to be defective among the multiple first elements 12 can be heated with high precision.

According to the embodiment, the first bonding part 13, the second bonding part 22, and the third bonding part 16 include gold. In the first bonding process, the portion of the first bonding part 13 that includes gold and the portion of the second bonding part 22 that includes gold are bonded. For example, the outermost surface of the first bonding part 13 that is made of gold and the outermost surface of the second bonding part 22 that is made of gold are bonded. Subsequently, the first element 12x that is determined to be defective is removed by generating thermal stress at the bonding interface between the first bonding part 13 and the second bonding part 22. Here, for example, when the first bonding part 13 and the second bonding part 22 are bonded in the first bonding process by using a bonding material that includes tin, residue of the bonding material undesirably remains on the surface of the second bonding part 22 after the first element 12x determined to be defective is removed. Also, for example, even when plating is used to bond the first bonding part 13 and the second bonding part 22 in the first bonding process, residue of the plating undesirably remains on the surface of the second bonding part 22r after the first element 12x determined to be defective is removed. Therefore, there is a possibility that the bonding strength between the second element 15 and the second bonding part 22r may be reduced by residue of the bonding or plating material when bonding the second element 15 to the second bonding part 22r at which the first element 12x had been placed. Once bonding or plating that uses a bonding material that includes tin is performed, it is difficult to remove the bonding material or the plating material after the bonding.

According to the embodiment, the bond is released at the interface between the portion of the first bonding part 13 that includes gold and the portion of the second bonding part 22 that includes gold in the process of removing the first element 12x determined to be defective; therefore, residue does not easily remain on the surface of the second bonding part 22. Therefore, the bonding strength between the second element 15 and the second bonding part 22r can be increased when bonding the second element 15 to the second bonding part 22r at which the first element 12x had been placed. In the second bonding process, the portion of the third bonding part 16 that includes gold and the portion of the second bonding part 22 that includes gold are bonded. It is unnecessary to form a bonding material or plating that includes tin when bonding the second element 15 to the second bonding part 22; therefore, the processes can be simplified while increasing the bonding precision.

According to the embodiment, ultrasonic waves are not applied in the first and second bonding processes. Misalignment of the first and second elements 12 and 15 when bonding the first element 12 and the second element 15 to the wiring substrate 21 can be suppressed thereby.

The process of evaluating the electrical characteristic of the second elements 15 can be performed via the wiring substrate 21 after causing the third bonding part 16 of the second element 15 to contact the second bonding part 22r of the wiring substrate 21. The second element 15 can be removed by a technique similar to that of the first element 12x when the second element 15 is determined to be defective in this process. At this time, the third bonding part 16 can be bonded at the first bonding condition before evaluating the electrical characteristic so that the bonding state between the third bonding part 16 and the second bonding part 22r is in a temporary bonded state.

Modification of First Embodiment

Figure 9:
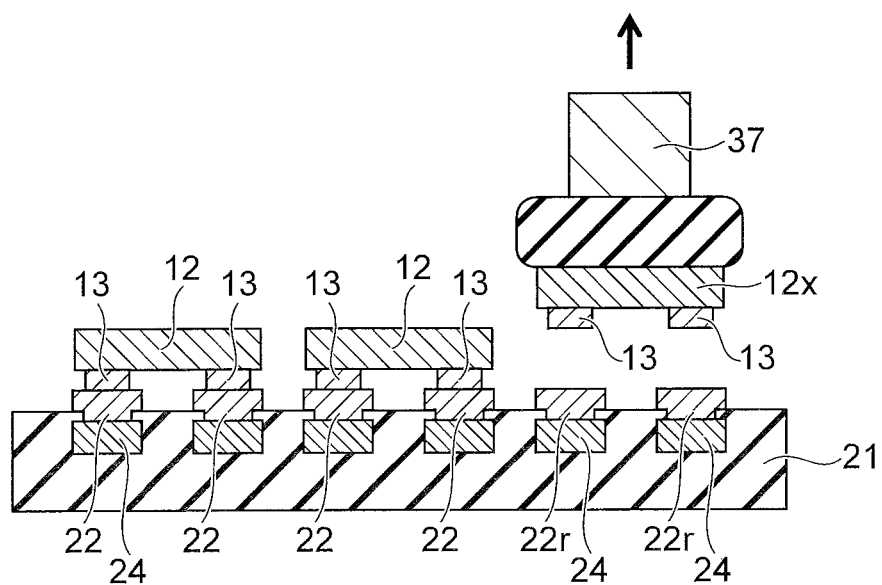
FIG. 9 is a cross-sectional view showing a method for manufacturing a light-emitting device according to a modification of the first embodiment.

FIG. 9 is a cross-sectional view showing a method for manufacturing a light-emitting device according to the modification.

Only portions of the modification that are different from the first embodiment are described. Other than the following, the method of the modification is similar to that of the first embodiment. This is similar for the second and third embodiments described below as well.

First, the processes shown in FIGS. 1A to 3 are performed.

Then, a jig 37 is prepared as shown in FIG. 9. For example, the jig 37 is adhesive. The size of the jig 37 is such that the jig 37 contacts only one first element 12x but does not contact the other first elements 12.

Then, the jig 37 is attached to the first element 12x determined to be defective. Then, the jig 37 is moved away from the wiring substrate 21 to separate the first element 12x from the wiring substrate 21.

Subsequently, the processes shown in FIGS. 6 and 7 are performed.

According to the modification, the first element 12x can be removed without heating. Therefore, compared to the first embodiment, the first elements 12 that are determined to be good are affected less.

Second Embodiment

A second embodiment is an example of manufacturing a light-emitting module by using the method for manufacturing the light-emitting device according to the first embodiment described above.

First, the configuration of the light-emitting module according to the embodiment will be described.

Figure 10:
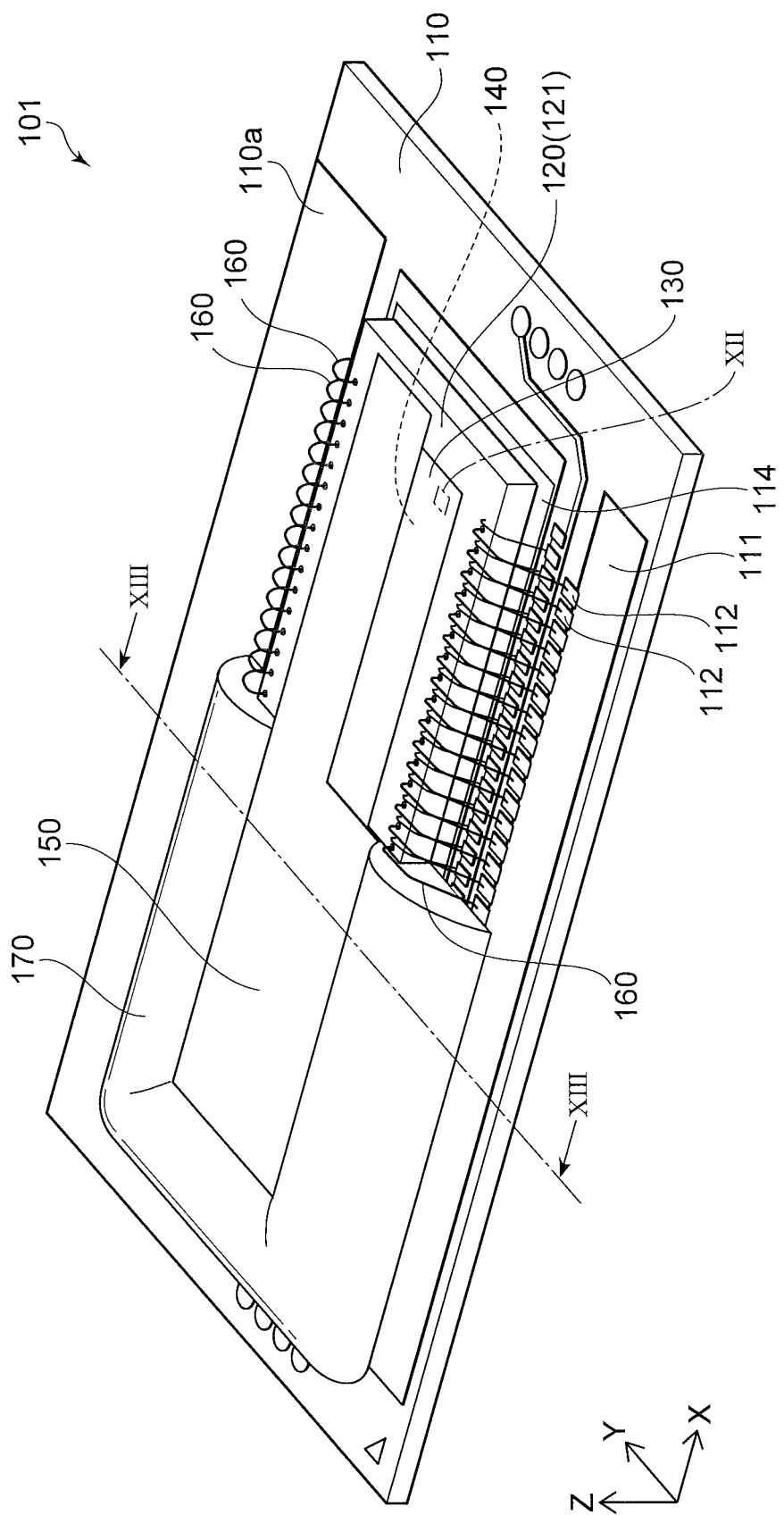
FIG. 10 is a perspective view showing a light-emitting module according to a second embodiment when viewed obliquely from above.

FIG. 10 is a perspective view showing the light-emitting module according to the embodiment when viewed obliquely from above.

Figure 11:
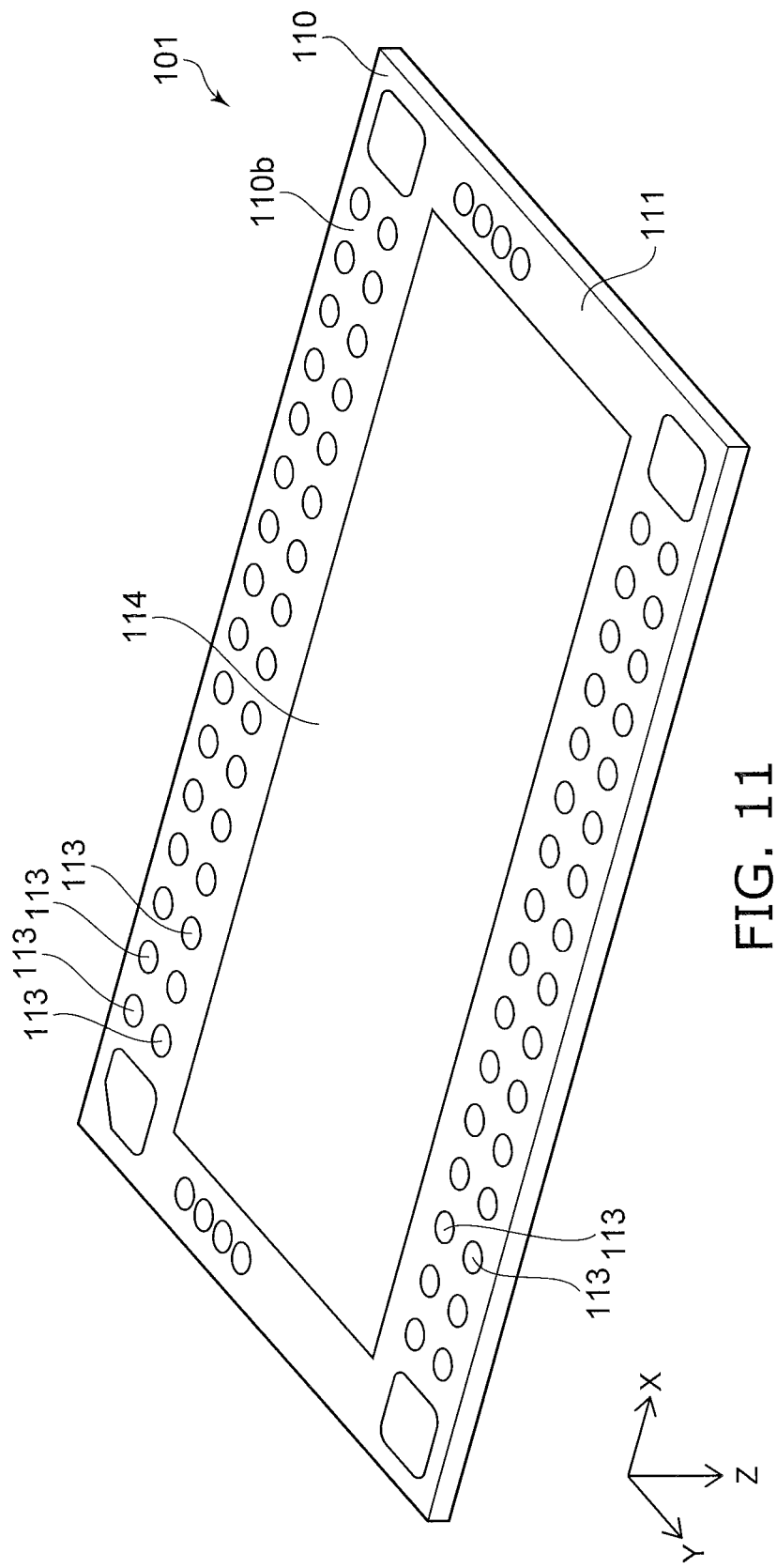
FIG. 11 is a perspective view showing the light-emitting module according to the second embodiment when viewed obliquely from below.

FIG. 11 is a perspective view showing the light-emitting module according to the embodiment when viewed obliquely from below.

Figure 12:
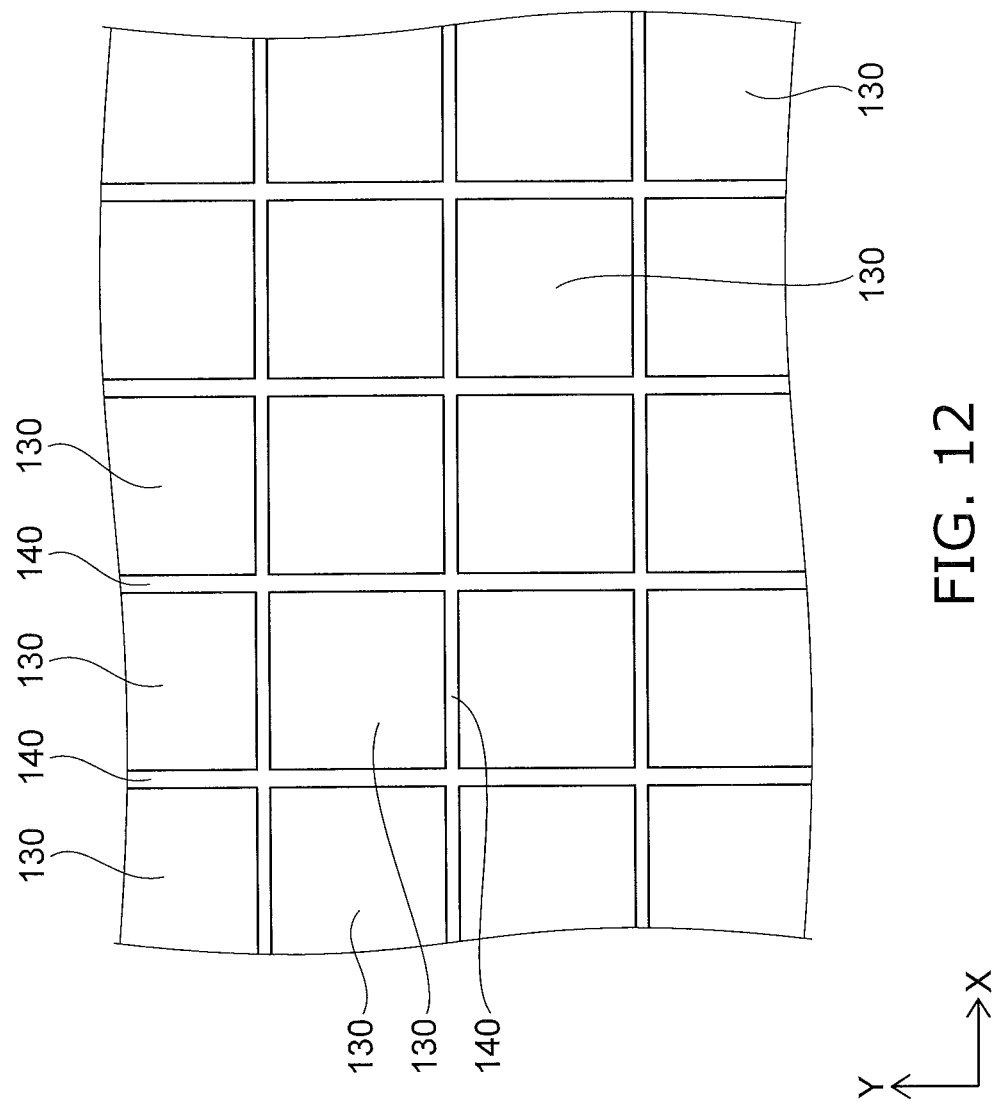
FIG. 12 is a partially enlarged top view showing region XII of FIG. 10.

FIG. 12 is a partially enlarged top view showing region XII of FIG. 10.

Figure 13:
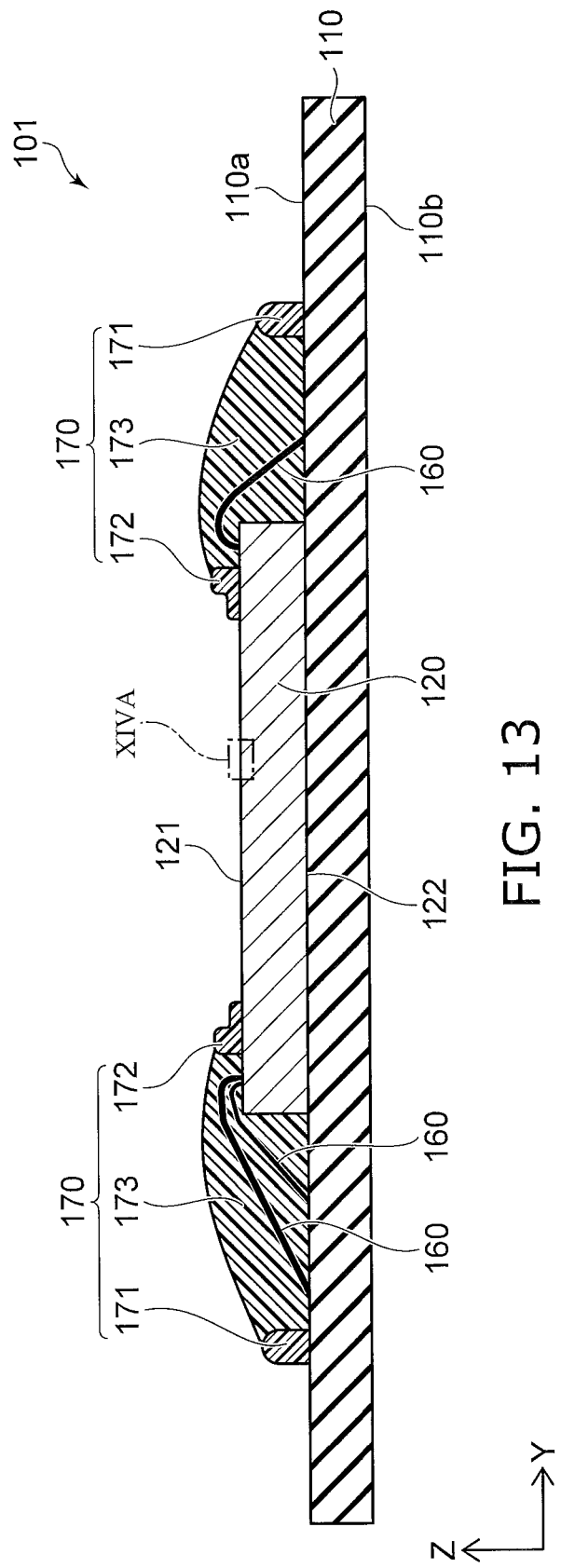
FIG. 13 is a cross-sectional view along line XIII-XIII shown in FIG. 10.

FIG. 13 is a cross-sectional view along line XIII-XIII shown in FIG. 10.

Figure 14A:
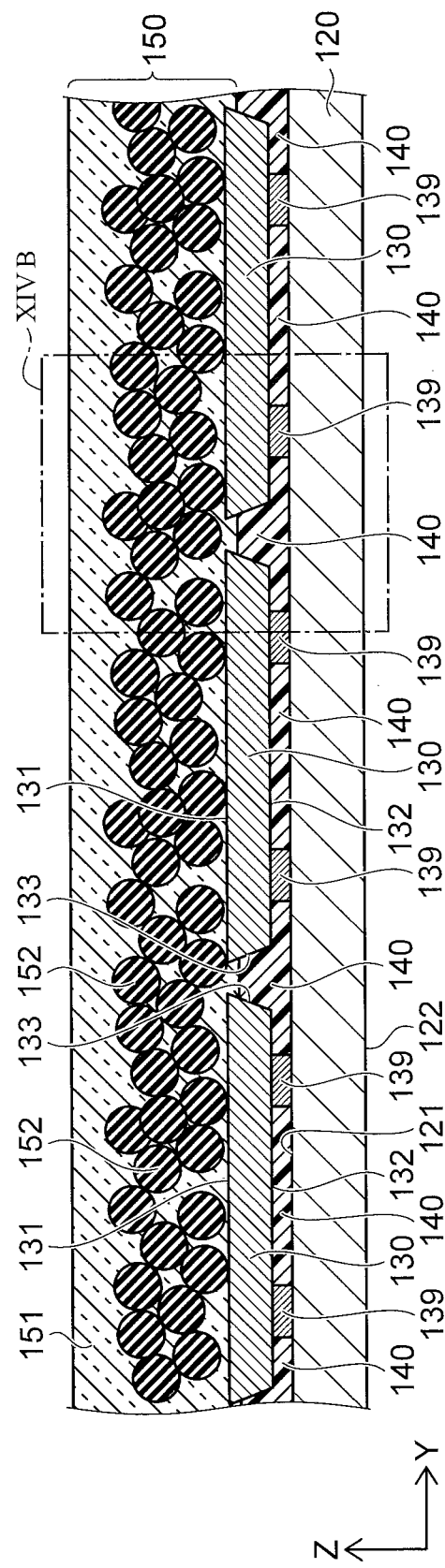
FIG. 14A is a partially enlarged cross-sectional view showing region XIVA of FIG. 13.

FIG. 14A is a partially enlarged cross-sectional view showing region XIVA of FIG. 13.

Figure 14B:
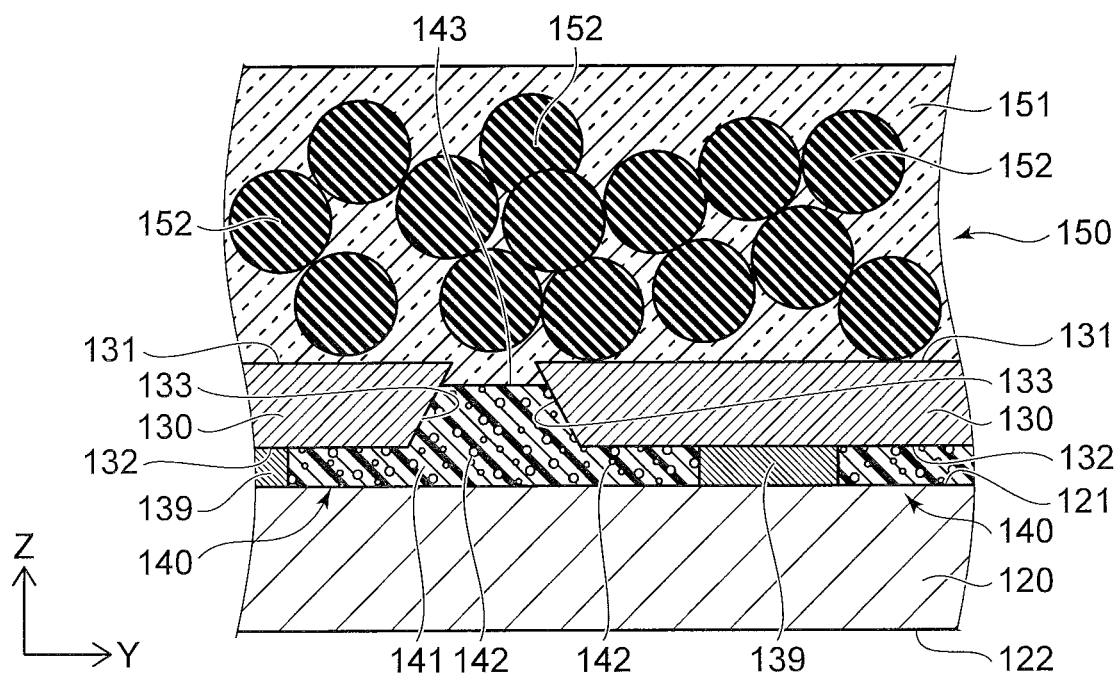
FIG. 14B is a partially enlarged cross-sectional view showing region XIVB of FIG. 14A.

FIG. 14B is a partially enlarged cross-sectional view showing region XIVB of FIG. 14A.

As shown in FIGS. 10 and 11, the light-emitting module 101 according to the embodiment includes a package substrate 110, a wiring substrate 120, multiple light-emitting elements 130, a first resin 140, a second resin 150, multiple wires 160, and a third resin 170. For convenience of illustration in FIG. 10, a portion of the third resin 170 and a portion of the second resin 150 are not illustrated, and a portion of the wire 160 and a portion of the light-emitting element 130 are visible.

The package substrate 110 is, for example, rectangular when viewed in plan view. The package substrate 110 includes, for example, an insulating base body 111 made of a ceramic material or a resin material. Multiple interconnects that are made of an electrically-conductive material, e.g., copper (Cu) are formed inside the insulating base body 111.

A portion of the interconnects is exposed at an upper surface 110a of the package substrate 110 and used to form multiple first pads 112, and another portion of the interconnects is exposed at a lower surface 110b of the package substrate 110 and used to form multiple second pads 113.

According to the embodiment, XYZ orthogonal coordinates are employed for convenience of description. The longitudinal direction of the package substrate 110 is taken as an "X-direction"; the transverse direction is taken as a "Y-direction"; and the thickness direction is taken as a "Z-direction". Among the Z-directions, the direction from the lower surface 110b of the package substrate 110 toward the upper surface 110a also is called "up", and the opposite direction also is called "down"; however, these expressions are for convenience and are independent of the direction of gravity.

A heat dissipation part 114 that is made of a thermally-conductive material, e.g., copper is exposed at the upper surface 110a and the lower surface 110b of the package substrate 110. The heat dissipation part 114 is located at the central portion of the package substrate 110 when viewed in plan view. The first pad 112 and the second pad 113 are located at the two sides in the Y-direction of the heat dissipation part 114. For example, the first pads 112 and the second pads 113 are arranged along the long sides of the package substrate 110.

The wiring substrate 120 is located on the heat dissipation part 114 of the package substrate 110. The wiring substrate 120 is, for example, a silicon substrate in which an integrated circuit is embedded, e.g., an application specific integrated circuit substrate (ASIC substrate). For example, the lower surface of the wiring substrate 120 is bonded to the upper surface of the heat dissipation part 114 via a bonding member. The bonding member includes, for example, a silicone silver paste. Pads that are connected to the light-emitting elements 130 are located at the central portion of an upper surface 121 of the wiring substrate 120. The external connection pads are located at the periphery of the pads connected to the light-emitting elements 130.

The wires 160 are connected to the first pads 112 of the package substrate 110 and the external connection pads of the wiring substrate 120. For example, the wires 160 are made of gold (Au). For example, the number of the wires 160 is equal to the number of the first pads 112.

When viewed in plan view, the third resin 170 is rectangular along the outer edge of the wiring substrate 120. The third resin 170 is located at the upper surface of the package substrate 110 and the upper surface of the wiring substrate 120 and covers the first pads 112 of the package substrate 110, the wires 160, and the external connection pads of the wiring substrate 120. The central portion of the third resin 170 is open when viewed in plan view. Thereby, the third resin 170 does not cover the multiple light-emitting elements 130, the first resin 140, and the second resin 150.

As shown in FIG. 13, the third resin 170 includes a first resin frame 171 located on the package substrate 110, a second resin frame 172 located on the wiring substrate 120, and a protective resin 173 located between the first resin frame 171 and the second resin frame 172. The first resin frame 171 is located in the package substrate 110. The second resin frame 172 is located on the wiring substrate 120. The protective resin 173 continuously covers the upper surface of the package substrate 110, the upper surface of the wiring substrate 120, and the surface of the wire 160. For example, the first resin frame 171 and the second resin frame 172 are made of light-transmitting resins, and are made of, for example, a dimethyl silicone resin. For example, in the protective resin 173, a light-reflective substance is included in a base material made of a light-transmitting resin. The resin can include, for example, a dimethyl silicone resin. The light-reflective substance is, for example, titanium oxide.

As shown in FIG. 10, FIG. 12, and FIG. 13, the multiple light-emitting elements 130 are placed on the central portion of the upper surface 121 of the wiring substrate 120. For example, the multiple light-emitting elements 130 are arranged in a matrix configuration. In an example, four segments each include 64 rows and 64 columns of the light-emitting elements 130 for a total of 16,384 light-emitting elements 130. In an example, the size of each light-emitting element 130 is not less than 40 μm and not more than 50 μm. In an example, the distance between adjacent light-emitting elements 130 is not less than 4 μm and not more than 8 μm. The light-emitting element 130 is connected to pads exposed at the upper surface 121 of the wiring substrate 120. The light-emitting element 130 is, for example, a light-emitting diode (LED) and emits, for example, blue light.

As shown in FIG. 14A, the light-emitting element 130 includes an upper surface 131, a lower surface 132 at the side opposite to the upper surface 131, and side surfaces 133 located between the upper surface 131 and the lower surface 132. The side surface 133 is sloped to spread from the lower surface 132 toward the upper surface 131. Four side surfaces 133 are included. The lower surface 132 of the light-emitting element 130 faces the upper surface 121 of the wiring substrate 120. The light-emitting element 130 is connected to the pads of the wiring substrate 120 via a pair of bonding parts 139. Therefore, the lower surface 132 of the light-emitting element 130 is separated from the upper surface 121 of the wiring substrate 120. The bonding parts 139 include gold.

The first resin 140 is located between the upper surface 121 of the wiring substrate 120 and the lower surface 132 of the light-emitting element 130 and between the side surfaces 133 of the adjacent light-emitting elements 130. In the first resin 140, a light-reflective substance 142 is included in a base material 141 made of a light-transmitting resin. It is favorable for the concentration of the light-reflective substance 142 in the first resin 140 to be not less than 50% by mass and not more than 70% by mass, e.g., 60% by mass. The light-transmitting resin is, for example, a dimethyl silicone resin. The light-reflective substance is, for example, titanium oxide.

The second resin 150 covers the upper surface 131 of the light-emitting element 130 and an upper surface 143 of the first resin 140. The second resin 150 contacts the upper surface 131 of the light-emitting element 130, the upper portion of the side surface 133, and the upper surface 143 of the first resin 140. In the second resin 150, a fluorescer 152 is included in a base material 151 made of a light-transmitting resin. For example, the fluorescer 152 absorbs blue light from the light-emitting element 130 and radiates yellow light.

As shown in FIG. 14B, the upper surface 143 of the first resin 140 between the adjacent light-emitting elements 130 is positioned between the upper surface 131 and the lower surface 132 of the light-emitting element 130 in the Z-direction, i.e., the direction from the wiring substrate 120 toward the second resin 150. Thereby, the lower portions of the side surfaces 133 of the light-emitting element 130 are covered with the first resin 140, and the upper portions of the side surfaces 133 are covered with the second resin 150.

The configuration of the light-emitting element 130 will now be described.

Figure 15:
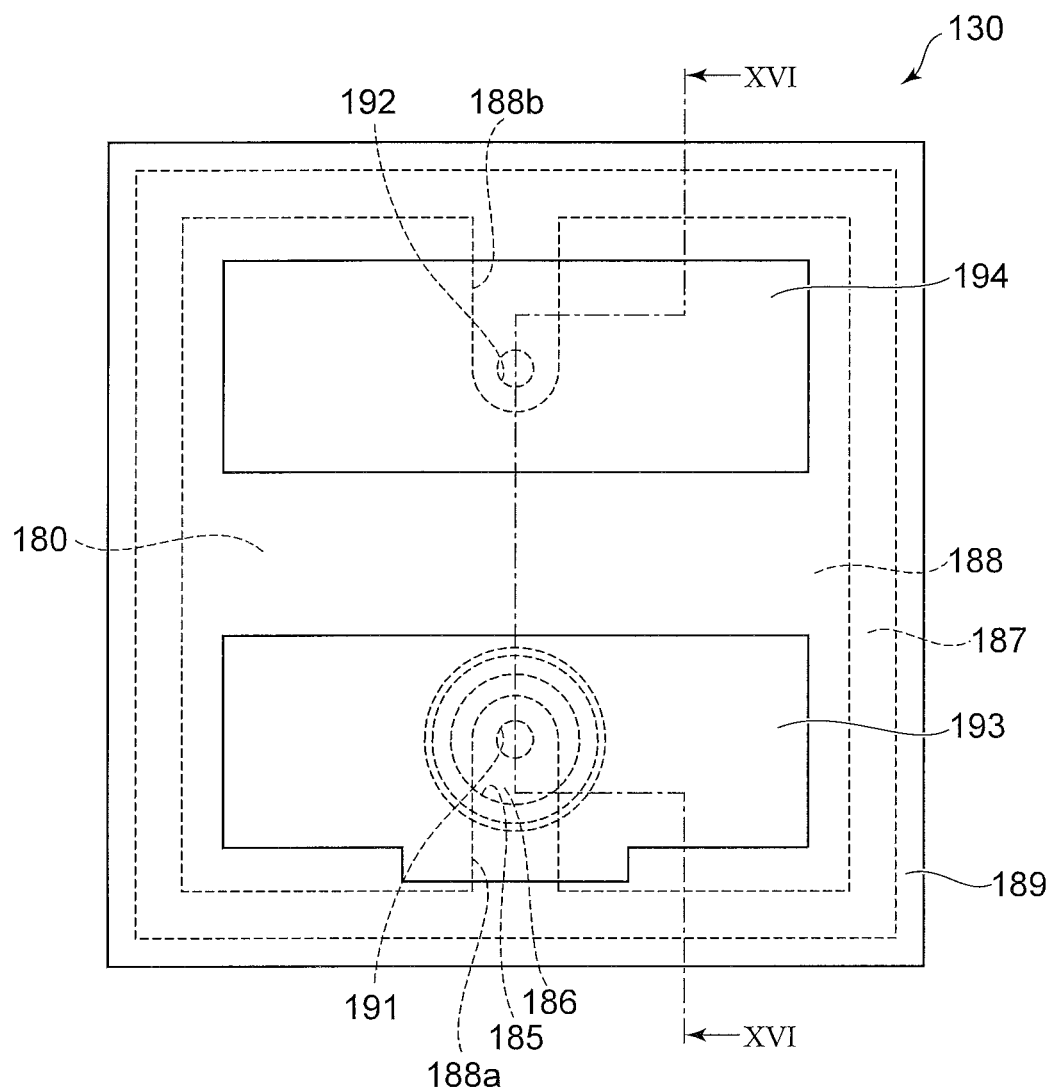
FIG. 15 is a top view showing a light-emitting element according to the second embodiment.

FIG. 15 is a top view showing the light-emitting element according to the embodiment.

Figure 16:
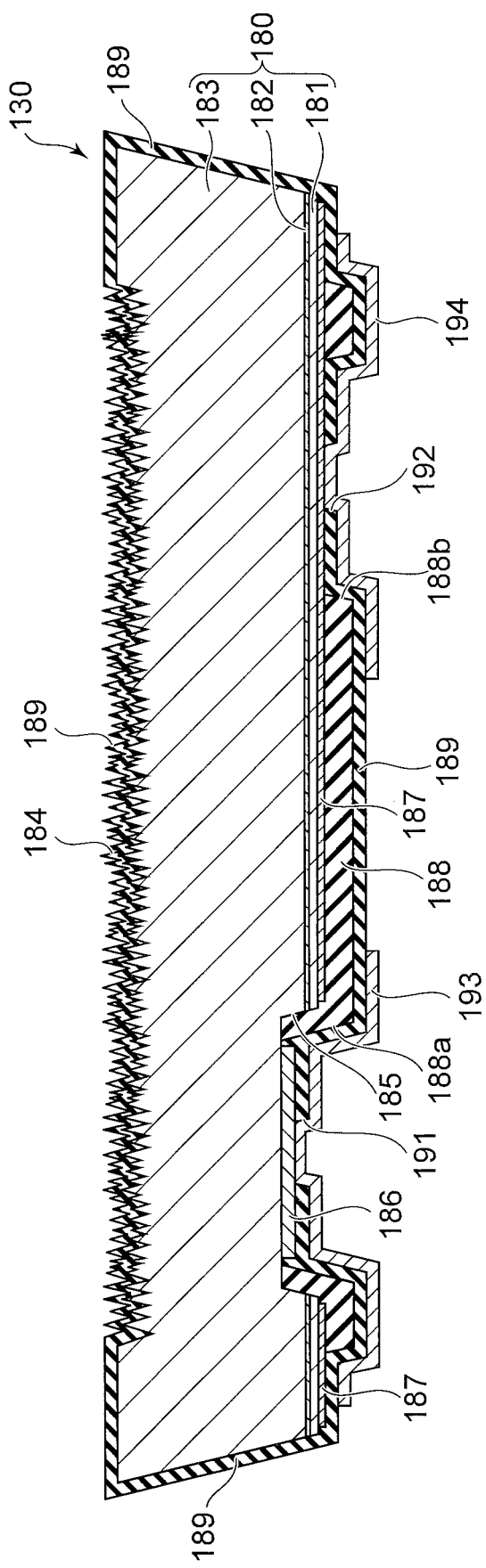
FIG. 16 is a cross-sectional view along line XVI-XVI shown in FIG. 15.

FIG. 16 is a cross-sectional view along line XVI-XVI shown in FIG. 15.

The light-emitting element 130 of the embodiment corresponds to the first element 12 of the first embodiment.

As shown in FIGS. 15 and 16, a semiconductor part 180 is included in the light-emitting element 130. The semiconductor part 180 includes, for example, gallium nitride (GaN). A p-type layer 181, a light-emitting layer 182, and an n-type layer 183 are stacked in this order upward from below in the semiconductor part 180. The p-type layer 181 includes a semiconductor layer that includes a p-type impurity. For example, magnesium (Mg) is used as the p-type impurity. The n-type layer 183 includes a semiconductor layer that includes an n-type impurity. For example, silicon (Si) is used as the n-type impurity.

Multiple protrusions 184 are formed in the upper surface of the n-type layer 183 of the semiconductor part 180.

A hole 185 is formed in the lower surface of the p-type layer 181 of the semiconductor part 180. The hole 185 extends from the lower surface side of the p-type layer 181 through the p-type layer 181 and the light-emitting layer 182 and reaches partway through the n-type layer 183. The hole 185 is, for example, circular when viewed in plan view. An n-electrode 186 is located at the bottom surface of the hole 185. The n-electrode 186 is electrically connected to the n-type layer 183.

For example, the n-electrode 186 has a stacked structure in which multiple metal layers are stacked. For example, the n-electrode 186 can have a stacked structure in which a Ti layer, an AlCu layer, a Ti layer, and a Ru layer are stacked in this order from the n-type layer 183 side. In the stacked structure described above, for example, the thickness of the Ti layer of the first layer can be 1.2 nm, the thickness of the AlCu layer of the second layer can be 200 nm, the thickness of the Ti layer of the third layer can be 150 nm, and the thickness of the Ru layer of the fourth layer can be 100 nm. A p-electrode 187 is located at the region of the lower surface of the p-type layer 181 other than the hole 185. The p-electrode 187 is electrically connected with the p-type layer 181. The p-electrode 187 is transmissive and is made of, for example, indium-tin-oxide (ITO). The thickness of the p-electrode 187 is, for example, not less than 150 nm and not more than 300 nm.

A light-reflecting layer 188 is located at the lower surface of the semiconductor part 180 to cover a portion of the p-electrode 187. When viewed in plan view, the light-reflecting layer 188 is substantially rectangular and has two notches 188a and 188b extending inward from two mutually facing sides. The notch 188a reaches the hole 185 and exposes the bottom surface of the hole 185. The light-reflecting layer 188 also covers the side surface of the hole 185. The light-reflecting layer 188 can include, for example, a dielectric multilayer film in which multiple dielectric bodies are stacked.

An insulating layer 189 is located at the surface of the semiconductor part 180. Openings 191 and 192 are formed in the insulating layer 189 at the lower surface of the semiconductor part 180. The opening 191 is positioned at the central portion of the bottom surface of the hole 185 inside the notch 188a of the light-reflecting layer 188. The opening 192 is positioned inside the notch 188b of the light-reflecting layer 188. The insulating layer 189 covers a portion of the p-electrode 187 and a portion of the light-reflecting layer 188. The insulating layer 189 is made of, for example, $SiO_2$. The thickness of the insulating layer 189 is, for example, 400 nm in the regions covering the multiple protrusions 184 and 550 nm is the other regions.

Two electrically-conductive layers 193 and 194 are located at the lower surface of the semiconductor part 180. The two electrically-conductive layers 193 and 194 correspond to the first bonding part 13 described above. The electrically-conductive layers 193 and 194 are substantially rectangular when viewed in plan view. The electrically-conductive layer 193 is electrically connected to the n-electrode 186 via the opening 191 of the insulating layer 189. Accordingly, the electrically-conductive layer 193 is connected to the n-type layer 183 via the n-electrode 186. The electrically-conductive layer 194 is connected to the p-type layer 181 via the opening 192 of the insulating layer 189. For example, the electrically-conductive layers 193 and 194 have stacked structures in which multiple metal layers are stacked. For example, the electrically-conductive layers 193 and 194 can have stacked structures in which a Ti layer, a Rh layer, and an Au layer are stacked in this order from the semiconductor part 180 side. In the stacked structure described above, for example, the thickness of the Ti layer is 3.5 nm, the thickness of the Rh layer is 400 nm, and the thickness of the Au layer is 100 nm. The electrically-conductive layers 193 and 194 can be porous and can include multiple pores inside the electrically-conductive layers 193 and 194.

A method for manufacturing the light-emitting module according to the second embodiment will now be described.

The wiring substrate 120 is prepared as shown in FIGS. 10 and 13. The wiring substrate 120 of the second embodiment corresponds to the wiring substrate 21 according to the first embodiment. Then, the multiple light-emitting elements 130 are mounted on the wiring substrate 120. The light-emitting elements 130 of the second embodiment correspond to the first elements 12 according to the first embodiment.

At this time, as described in the first embodiment, the light-emitting elements 130 are bonded to the wiring substrate 120 in a temporary bonded state, the electrical characteristic, e.g., the luminance of the light-emitting elements 130 is evaluated, and the light-emitting elements 130 that are determined to be defective are removed. Then, new light-emitting elements 130 are placed on the regions from which the light-emitting elements 130 determined to be defective were removed, and all of the light-emitting elements 130 are collectively bonded to be in the main bonded state. The new light-emitting elements 130 according to the embodiment correspond to the second element 15 according to the first embodiment. Thereby, the defective light-emitting elements 130 (the first elements) are replaced with good light-emitting elements 130 (the second elements). Also, the bonding parts 139 are formed between the wiring substrate 120 and the light-emitting elements 130. The bonding parts 139 of the embodiment correspond to the fourth bonding part 36 of the first embodiment.

Then, the first resin 140 is formed to cover the wiring substrate 120 and the light-emitting elements 130. Then, the first resin 140 that is on the light-emitting elements 130 is removed. Then, for example, the wiring substrate 120 is placed on the package substrate 110 with silicone silver paste interposed. Then, the first pads 112 of the package substrate 110 and the external connection pads of the wiring substrate 120 are connected by the wires 160. Then, the first resin frame 171 is formed on the package substrate 110, and the second resin frame 172 is formed on the wiring substrate 120. Then, the protective resin 173 is formed between the first resin frame 171 and the second resin frame 172. The third resin 170 that protects the wires 160 is formed thereby.

Continuing, the second resin 150 is placed in a half-cured state on the multiple light-emitting elements 130 and on the first resin 140. In the second resin 150 as described above, the fluorescer 152 is included in the base material 151. The second resin 150 is located inward of the third resin 170 in a plan view. The second resin 150 covers the region in which the multiple light-emitting elements 130 are located.

Then, the second resin 150 is cured by heat treatment. At this time, when the second resin 150 is heated to a first temperature, e.g., 100° C., the second resin 150 is liquefied and penetrates the gap between the light-emitting elements 130 in the space on the first resin 140. Thereby, the second resin 150 contacts the upper portions of the side surfaces 133 of the light-emitting elements 130. Then, when the second resin 150 is heated to a second temperature, e.g., 150° C., that is greater than the first temperature, the second resin 150 is finally cured. Thus, the light-emitting module 101 according to the embodiment is manufactured.

First Modification of Second Embodiment

The configuration of a light-emitting element of a first modification of the second embodiment is different from that of the second embodiment described above.

Figure 17:
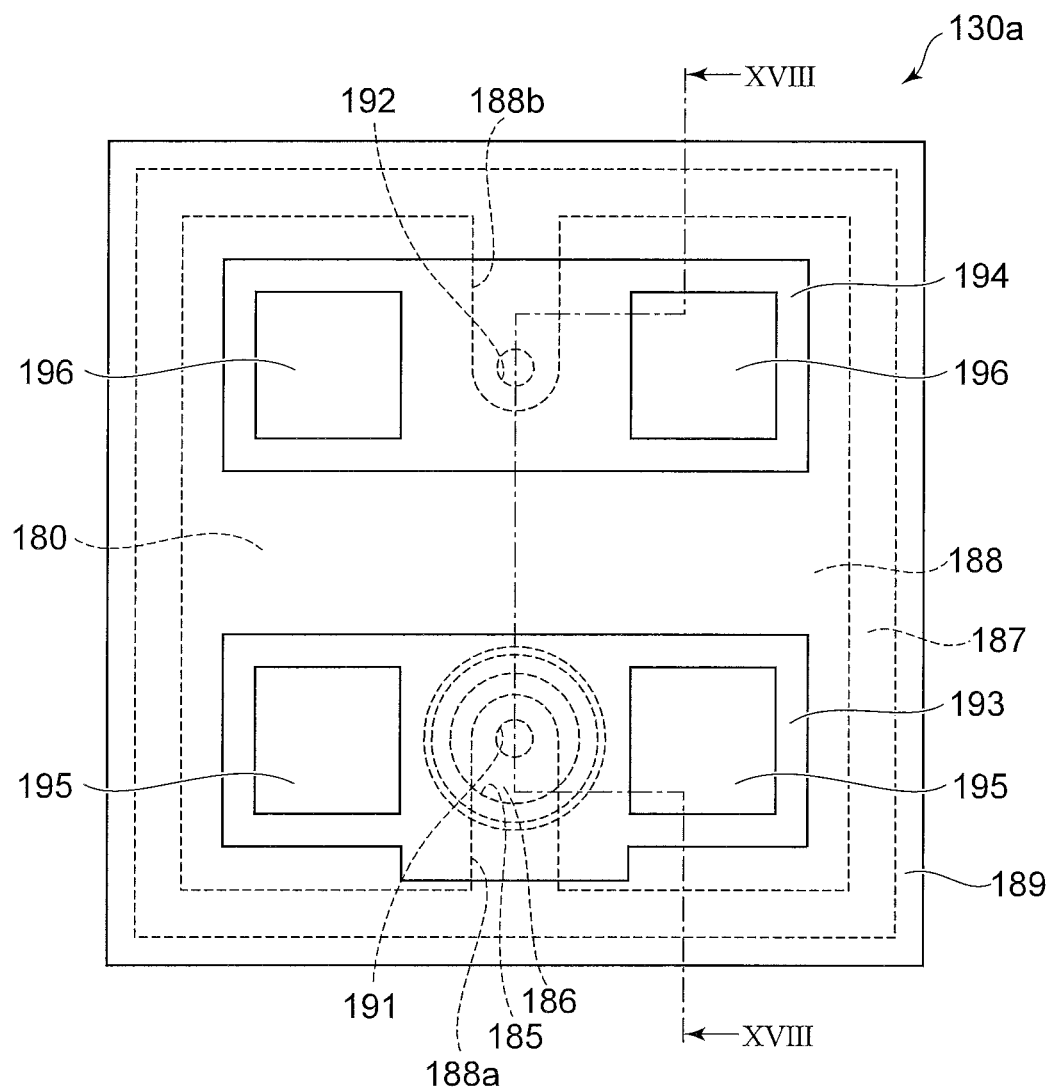
FIG. 17 is a top view showing a light-emitting element of a first modification of the second embodiment.

FIG. 17 is a top view showing the light-emitting element of the modification.

Figure 18:
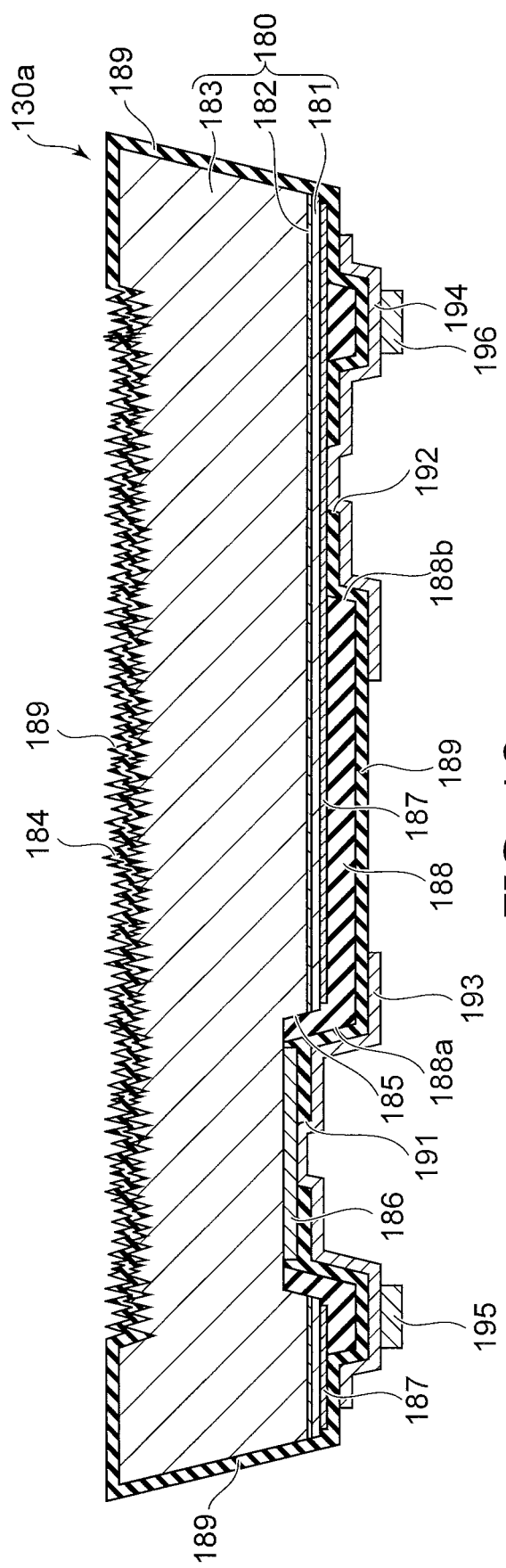
FIG. 18 is a cross-sectional view along line XVIII-XVIII shown in FIG. 17.

FIG. 18 is a cross-sectional view along line XVIII-XVIII shown in FIG. 17.

In the light-emitting element 130a of the modification as shown in FIGS. 17 and 18, two electrically-conductive members 195 are located at the lower surface of the electrically-conductive layer 193, and two electrically-conductive members 196 are located at the lower surface of the electrically-conductive layer 194. The electrically-conductive members 195 and 196 include, for example, gold. The total surface area of the two electrically-conductive members 195 is less than the surface area of the electrically-conductive layer 193 when viewed in plan view. Also, the total surface area of the two electrically-conductive members 196 is less than the surface area of the electrically-conductive layer 194 when viewed in plan view.

Although the electrically-conductive members 195 and 196 are, for example, rectangular, circular, elliptical, etc., when viewed in plan view, the electrically-conductive members 195 and 196 are not limited thereto. In the example shown in FIGS. 17 and 18, the electrically-conductive members 195 and 196 are rectangular when viewed in plan view. In such a case, the length of one side of the electrically-conductive members 195 and 196 can be, for example, not less than 5 μm and not more than 15 μm, e.g., 10 μm. The shapes of the electrically-conductive members 195 and 196 can be such that the widths decrease toward the tips, that is, away from the electrically-conductive layers 193 and 194, when viewed in cross-section. The heights of the electrically-conductive members 195 and 196 can be, for example, not less than 1 μm and not more than 5 μm.

According to the modification, the electrically-conductive members 195 and 196 are located respectively at the lower surfaces of the electrically-conductive layers 193 and 194 so that the electrically-conductive members 195 and 196 of the light-emitting element 130a contact the wiring substrate 120 when the light-emitting element 130a is temporarily bonded to the wiring substrate 120. Thereby, the contact area can be less than when the electrically-conductive layers 193 and 194 contact the wiring substrate 120, and the load that is applied in the temporary bonding can be reduced. As a result, the light-emitting element 130a that is determined to be defective can be easily removed, and damage of the wiring substrate 120 and the light-emitting element 130a can be suppressed. Otherwise, the manufacturing method and the configuration of the modification are similar to those of the second embodiment.

Second Modification of Second Embodiment

In a second modification of the second embodiment as well, the configuration of the light-emitting element is different from that of the second embodiment described above.

Figure 19:
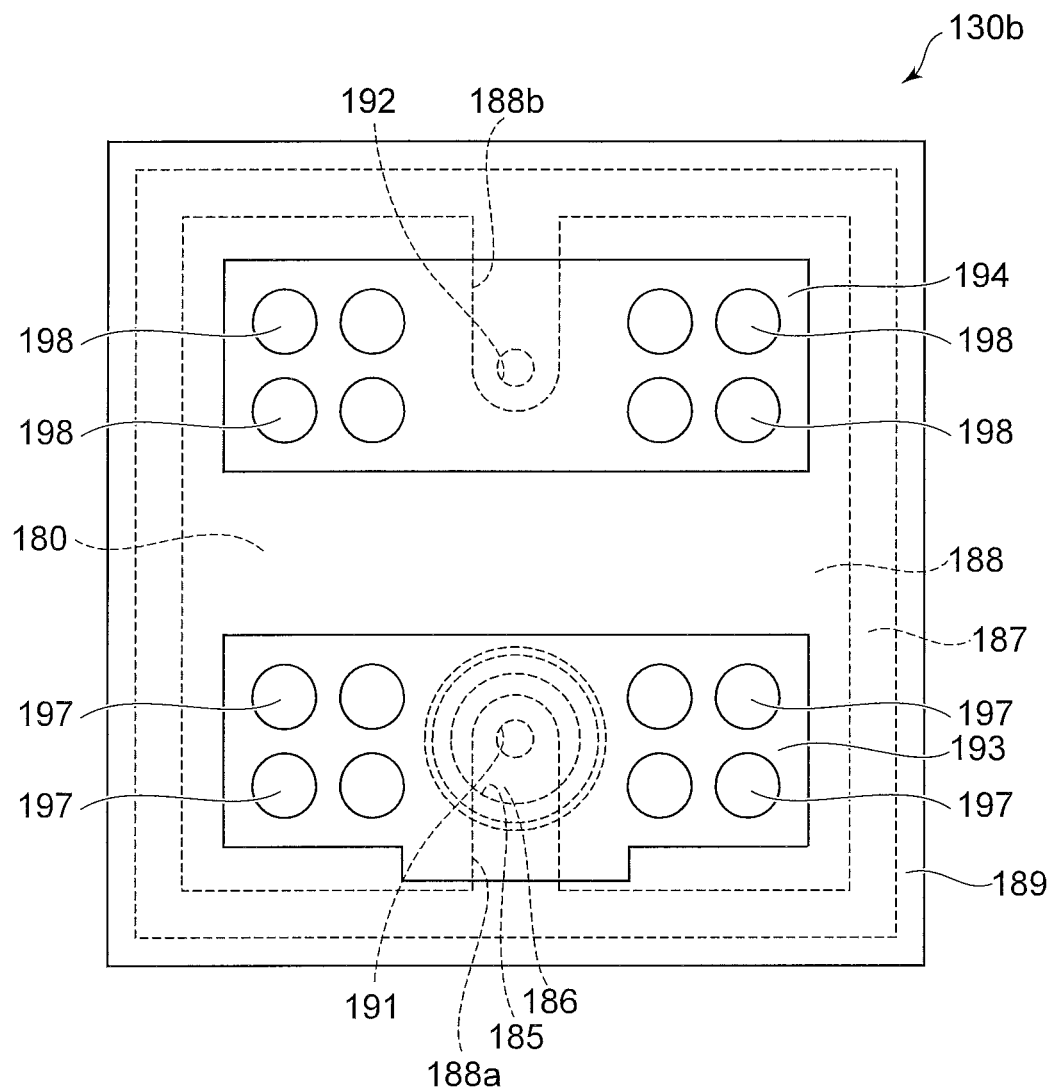
FIG. 19 is a top view showing a light-emitting element of a second modification of the second embodiment.

FIG. 19 is a top view showing the light-emitting element of the modification.

In the light-emitting element 130b of the modification as shown in FIG. 19, eight electrically-conductive members 197 are located at the lower surface of the electrically-conductive layer 193, and eight electrically-conductive members 198 are located at the lower surface of the electrically-conductive layer 194. The electrically-conductive members 197 and 198 include, for example, gold. The total surface area of the eight electrically-conductive members 197 is less than the surface area of the electrically-conductive layer 193 when viewed in plan view. The total surface area of the eight electrically-conductive members 198 is less than the surface area of the electrically-conductive layer 194 when viewed in plan view.

The electrically-conductive members 197 and 198 are, for example, circular when viewed in plan view. In such a case, the diameters of the electrically-conductive members 197 and 198 can be, for example, not less than 2 μm and not more than 5 μm, e.g., 3 μm. The shapes of the electrically-conductive members 197 and 198 can be such that the widths decrease toward the tips when viewed in cross-section. The heights of the electrically-conductive members 197 and 198 can be, for example, not less than 1 μm and not more than 5 μm. Otherwise, the manufacturing method, the configuration, and the effects of the modification are similar to those of the first modification of the second embodiment.

Third Embodiment

The third embodiment also is an example in which a light-emitting module is manufactured using the method for manufacturing the light-emitting device according to the first embodiment described above.

First, the configuration of the light-emitting module according to the embodiment will be described.

Figure 20A:
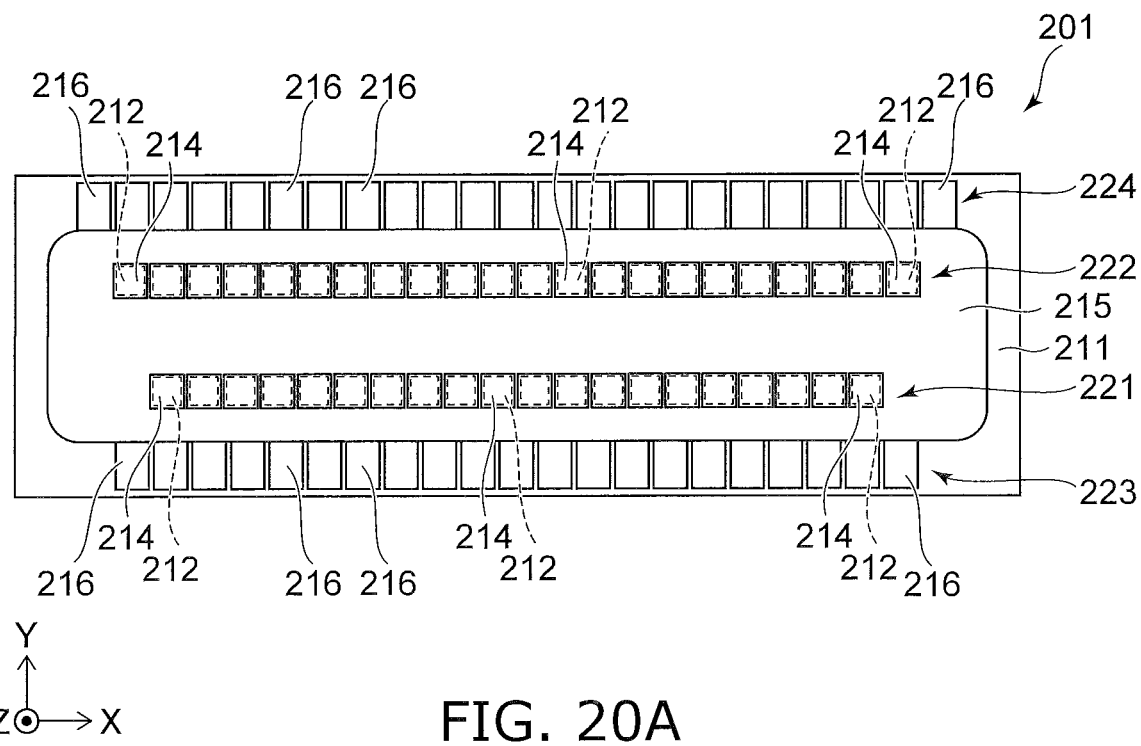
FIG. 20A is a top view showing a light-emitting module according to a third embodiment.

FIG. 20A is a top view showing the light-emitting module according to the embodiment.

Figure 20B:
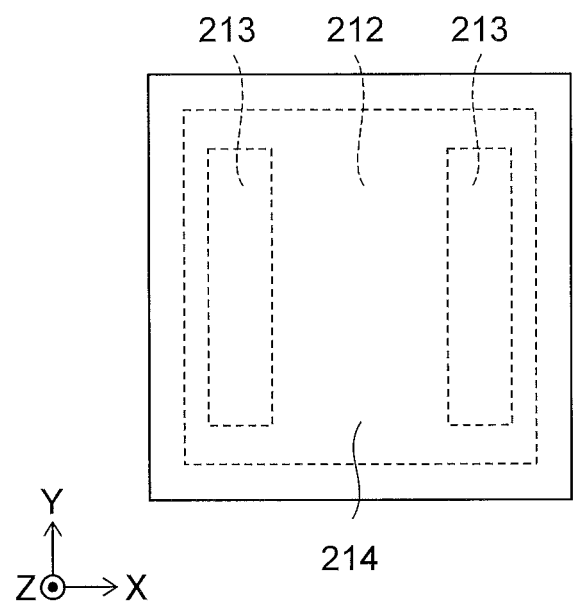
FIG. 20B is a partially enlarged top view showing one wavelength conversion member.

FIG. 20B is a partially enlarged top view showing one wavelength conversion member.

Similarly to the second embodiment, an XYZ orthogonal coordinate system is employed in the embodiment as well.

As shown in FIGS. 20A and 20B, the light-emitting module 201 according to the embodiment includes a wiring substrate 211. The wiring substrate 211 is, for example, rectangular when viewed in plan view. Multiple light-emitting elements 212 are located at the upper surface of the wiring substrate 211. Two bonding parts 213 are located on each light-emitting element 212, and each light-emitting element 212 is mounted to the wiring substrate 211 via the bonding parts 213. The bonding parts 213 include gold.

For example, the light-emitting elements 212 are arranged in two columns at the upper surface of the wiring substrate 211. Each column extends in the longitudinal direction of the wiring substrate 211, i.e., the X-direction. For example, twenty light-emitting elements 212 are arranged in the first column 221, and, for example, twenty-two light-emitting elements 212 are arranged in the second column 222. Accordingly, a total of forty-two light-emitting elements 212 are included in the light-emitting module 201. In an example, each light-emitting element 212 is square when viewed in plan view, with the length of one side being not less than 500 μm and not more than 1000 μm.

Wavelength conversion members 214 are located respectively on the light-emitting elements 212. The wavelength conversion member 214 is, for example, a plate-shaped member that includes YAG (Yttrium Aluminum Garnet) as a fluorescer. In an example, each wavelength conversion member 214 is square when viewed in plan view, with a length of one side being not less than 550 μm and not more than 1100 μm. In an example, the distance between the adjacent wavelength conversion members 214 of each column is not less than 30 μm and not more than 70 μm. The number of the wavelength conversion members 214 is equal to the number of the light-emitting elements 212.

A resin member 215 is located on the wiring substrate 211. The resin member 215 covers the central portion of the upper surface of the wiring substrate 211. The resin member 215 covers the side surface of the light-emitting element 212 and the side surface of the wavelength conversion member 214 but does not cover the upper surface of the wavelength conversion member 214. Accordingly, the upper surface of the wavelength conversion member 214 is exposed from under the resin member 215. In the resin member 215, for example, a light-reflective substance is included in a light-transmitting resin. The resin is, for example, a dimethyl silicone resin. The light-reflective substance is, for example, titanium oxide.

Pads 216 are located at the upper surface of the wiring substrate 211 at the two Y-direction sides of the region covered with the resin member 215. The pads 216 are arranged in two columns along the edges of the wiring substrate 211 extending in the X-direction. A third column 223 of the pads 216 is located at the first column 221 side of the light-emitting element 212. A fourth column 224 of the pads 216 is located at the second column 222 side of the light-emitting element 212.

The number of the pads 216 belonging to each column is one greater than the number of the light-emitting elements 212 belonging to the corresponding column. In other words, twenty-one pads 216 are arranged in the third column 223, and twenty-three pads 216 are arranged in the fourth column 224. The twenty-one pads 216 that belong to the third column and the twenty light-emitting elements 212 that belong to the first column are connected alternately in series. Similarly, the twenty-three pads 216 that belong to the fourth column and the twenty-two light-emitting elements 212 that belong to the second column are connected alternately in series.

A method for manufacturing the light-emitting module according to the third embodiment will now be described.

The wiring substrate 211 is prepared as shown in FIGS. 20A and 20B. The pads 216 are formed at the upper surface of the wiring substrate 211. The wiring substrate 211 of the third embodiment corresponds to the wiring substrate 21 of the first embodiment. Then, the multiple light-emitting elements 212 are mounted on the wiring substrate 211. The light-emitting elements 212 of the third embodiment correspond to the first element 12 of the first embodiment.

At this time, as described in the first embodiment, the light-emitting elements 212 are bonded to the wiring substrate 211 in a temporary bonded state, the electrical characteristic, e.g., the luminance of the light-emitting element 212 is evaluated, and the light-emitting elements 212 that are determined to be defective are removed. Then, new light-emitting elements 212 are placed on the regions from which the light-emitting elements 212 determined to be defective were removed, and all of the light-emitting elements 212 are collectively bonded to be in the main bonded state. According to the embodiment, the new light-emitting elements 212 correspond to the second element 15 according to the first embodiment. Thereby, the defective light-emitting elements 212 are replaced with good parts. The bonding parts 213 are formed between the wiring substrate 211 and the light-emitting elements 212. The bonding parts 213 correspond to the fourth bonding part 36 of the first embodiment.

Then, the wavelength conversion members 214 are placed respectively on the light-emitting elements 212. Then, the resin member 215 is formed to cover the upper surface of the wiring substrate 211, the side surfaces of the light-emitting elements 212, and the side surfaces of the wavelength conversion members 214. Thus, the light-emitting module 201 according to the embodiment is manufactured.

Embodiments and their modifications described above are examples embodying the invention, and the invention is not limited to these embodiments and their modifications. For example, additions, deletions, or modifications of some of the components or processes according to the embodiments and modifications described above also are included in the invention. Also, the embodiments and modifications described above can be implemented in combination with each other.

For example, the invention can be utilized in vehicle headlights, light sources of display devices, etc.

What is claimed is:

1. A method for manufacturing a light-emitting device, the method comprising:
   preparing
      a first member including
         a support substrate, and
         a plurality of first elements, each of the plurality of first elements including a light extraction surface and a first bonding part located at a surface at a side opposite to the light extraction surface, the plurality of first elements being located on the support substrate so that the light extraction surfaces face the support substrate, and
      a second member including
         a wiring substrate, and
         a plurality of second bonding parts located on the wiring substrate;
   bonding the first bonding part and the second bonding part at a first bonding condition while applying a first load and releasing the support substrate from the first element;
   evaluating an electrical characteristic of the plurality of first elements;
   removing, from the wiring substrate, a defective first element of the plurality of first elements that is determined by the evaluation to be defective by releasing the defective first element from the second bonding part;
   placing a second element on a region of the wiring substrate at which the defective first element had been removed to cause a third bonding part of the second element to contact the second bonding part to which the first bonding part of the defective first element had been bonded; and bonding the third bonding part and the second bonding part at a second bonding condition while applying a second load, wherein:

the first bonding part, the second bonding part, and the third bonding part include gold, a temperature of the first bonding condition is not less than 80 degrees Celsius and not more than 200 degrees Celsius, and a temperature of the second bonding condition is not less than 200 degrees Celsius and not more than 300 degrees Celsius.

2. The method according to claim 1, wherein
a load applied to the first and second bonding parts at the first bonding condition is not less than 10 MPa but less than 150 MPa, and
a load applied to the first and second bonding parts at the second bonding condition is not less than 40 MPa and not more than 200 MPa.

3. The method according to claim 1, wherein
a duration of applying a load to the first and second bonding parts at the second bonding condition is greater than a duration of applying a load to the first and second bonding parts at the first bonding condition.

4. The method according to claim 1, wherein
the plurality of first elements is arranged in a matrix arrangement on the support substrate, and
the plurality of second bonding parts is arranged in a matrix arrangement on the wiring substrate.

5. The method according to claim 1, wherein
the removing of the defective first element from the wiring substrate includes heating the defective first element.

6. The method according to claim 5, wherein
the heating of the defective first element includes irradiating laser light on the defective first element.

7. The method according to claim 1, wherein
the removing of the defective first element from the wiring substrate includes releasing the defective first element from the wiring substrate by attaching a jig to the defective first element.

8. A method for manufacturing a light-emitting device, the method comprising:

preparing
a first member including
a support substrate, and
a plurality of first elements, each of the plurality of first elements including a light extraction surface and a first bonding part located at a surface at a side opposite to the light extraction surface, the plurality of first elements being located on the support substrate so that the light extraction surfaces face the support substrate, and
a second member including
a wiring substrate, and
a plurality of second bonding parts located on the wiring substrate;

bonding the first bonding part and the second bonding part at a first bonding condition while applying a first load and releasing the support substrate from the first element;

evaluating an electrical characteristic of the plurality of first elements;

removing, from the wiring substrate, a defective first element of the plurality of first elements that is determined by the evaluation to be defective by releasing the defective first element from the second bonding part;

placing a second element on a region of the wiring substrate at which the defective first element had been removed to cause a third bonding part of the second element to contact the second bonding part to which the first bonding part of the defective first element had been bonded; and bonding the third bonding part and the second bonding part at a second bonding condition while applying a second load, wherein;

a load applied to the first and second bonding parts at the first bonding condition is not less than 10 MPa but less than 150 MPa, and a load applied to the first and second bonding parts at the second bonding condition is not less than 40 MPa and not more than 200 MPa.

9. The method according to claim 8, wherein
the first bonding part, the second bonding part, and the third bonding part include gold.

10. The method according to claim 8, wherein
the plurality of first elements is arranged in a matrix arrangement on the support substrate, and
the plurality of second bonding parts is arranged in a matrix arrangement on the wiring substrate.

11. The method according to claim 8, wherein
the removing of the defective first element from the wiring substrate includes heating the defective first element.

12. The method according to claim 11, wherein
the heating of the defective first element includes irradiating laser light on the defective first element.

13. The method according to claim 8, wherein
the removing of the defective first element from the wiring substrate includes releasing the defective first element from the wiring substrate by attaching a jig to the defective first element.

14. A method for manufacturing a light-emitting device, the method comprising:

preparing
a first member including
a support substrate, and
a plurality of first elements, each of the plurality of first elements including a light extraction surface and a first bonding part located at a surface at a side opposite to the light extraction surface, the plurality of first elements being located on the support substrate so that the light extraction surfaces face the support substrate, and
a second member including
a wiring substrate, and
a plurality of second bonding parts located on the wiring substrate;

bonding the first bonding part and the second bonding part at a first bonding condition while applying a first load and releasing the support substrate from the first element;

evaluating an electrical characteristic of the plurality of first elements;

removing, from the wiring substrate, a defective first element of the plurality of first elements that is determined by the evaluation to be defective by releasing the defective first element from the second bonding part;

placing a second element on a region of the wiring substrate at which the defective first element had been removed to cause a third bonding part of the second element to contact the second bonding part to which the first bonding part of the defective first element had been bonded; and bonding the third bonding part and the second bonding part at a second bonding condition while applying a second load, wherein:

a duration of applying a load to the first and second bonding parts at the second bonding condition is greater than a duration of applying a load to the first and second bonding parts at the first bonding condition.

15. The method according to claim 14, wherein the first bonding part, the second bonding part, and the third bonding part include gold.

16. The method according to claim 14, wherein the plurality of first elements is arranged in a matrix arrangement on the support substrate, and
the plurality of second bonding parts is arranged in a matrix arrangement on the wiring substrate.

17. The method according to claim 14, wherein the removing of the defective first element from the wiring substrate includes heating the defective first element.

18. The method according to claim 17, wherein the heating of the defective first element includes irradiating laser light on the defective first element.

19. The method according to claim 14, wherein the removing of the defective first element from the wiring substrate includes releasing the defective first element from the wiring substrate by attaching a jig to the defective first element.

* * * * *